(12) United States Patent
Tatsukawa et al.

(10) Patent No.: US 6,380,636 B1
(45) Date of Patent: Apr. 30, 2002

(54) NONVOLATILE SEMICONDUCTOR MEMORY DEVICE HAVING AN ARRAY STRUCTURE SUITABLE TO HIGH-DENSITY INTEGRATIONIZATION

(75) Inventors: Satoshi Tatsukawa; Yuichi Kunori; Satoru Tamada, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/487,177

(22) Filed: Jan. 19, 2000

(30) Foreign Application Priority Data

Jul. 14, 1999 (JP) .............................. 11-200178

(51) Int. Cl.[7] ...................... H01L 27/112; G11C 16/04; G11C 8/00
(52) U.S. Cl. ............. 257/910; 365/185.11; 365/185.03; 365/185.17; 365/185.18; 365/230.03
(58) Field of Search ................................ 257/910, 390, 257/658; 365/230.03, 185.11, 185.03, 185.13, 185.17, 185.18, 185.09, 185.29

(56) References Cited

U.S. PATENT DOCUMENTS

| | | | | |
|---|---|---|---|---|
| 6,141,250 A | * | 10/2000 | Kashimura | 365/185.11 |
| 6,144,584 A | * | 11/2000 | Kunori et al. | 365/185.18 |
| 6,157,580 A | * | 12/2000 | Kohno | 365/189.09 |
| 6,178,116 B1 | * | 1/2001 | Iwahashi | 365/185.18 |
| 6,181,607 B1 | * | 1/2001 | Lee et al. | 365/185.29 |
| 6,188,603 B1 | * | 2/2001 | Takeda | 365/185.09 |
| 6,191,974 B1 | * | 2/2001 | Nishida et al. | 365/185.11 |
| 6,215,699 B1 | * | 4/2001 | Yamamoto | 365/185.09 |
| 6,240,022 B1 | * | 5/2001 | Sakui et al. | 365/185.29 |
| 6,256,227 B1 | * | 7/2001 | Atsumi et al. | 365/185.11 |
| 6,269,021 B1 | * | 7/2001 | Iwahashi | 365/185.11 |
| 6,295,227 B1 | * | 9/2001 | Sakui et al. | 365/185.17 |
| RE37,419 E | * | 10/2001 | Hsu et al. | 365/185.11 |
| 6,307,780 B1 | * | 10/2001 | Tanaka et al. | 365/185.13 |

FOREIGN PATENT DOCUMENTS

| | | |
|---|---|---|
| JP | 6-77437 | 3/1994 |
| JP | 6-318683 | 11/1994 |
| JP | 7-147095 | 6/1995 |
| JP | 7-193199 | 7/1995 |
| JP | 9-246404 | 9/1997 |

* cited by examiner

Primary Examiner—Matthew Smith
Assistant Examiner—Chuong A. Luu
(74) Attorney, Agent, or Firm—McDermott, Will & Emery

(57) ABSTRACT

In a memory cell array having sub-bit lines and sub-source lines formed of a diffusion layer, a main bit line is arranged commonly to the sub-bit lines arranged in multiple columns. A memory cell area can be reduced without restrictions by pitch conditions of the main bit lines.

18 Claims, 20 Drawing Sheets

NONVOLATILE SEMICONDUCTOR MEMORY DEVICE HAVING AN ARRAY STRUCTURE SUITABLE TO HIGH-DENSITY INTEGRATIONIZATION

BACKGROUND OF THE INVENTION

1. Field of the Invention

The present invention relates to a nonvolatile semiconductor memory device, and particularly to a structure of a nonvolatile memory cell array suitable to high-density integration.

2. Description of the Background Art

FIG. 2 schematically shows a structure of a memory cell array in a conventional nonvolatile semiconductor memory device. In FIG. 27, the memory cell array includes a plurality of nonvolatile memory cells MC arranged in rows and columns. FIG. 27 shows representatively nonvolatile memory cells MC11, MC12, MC21 and MC22 arranged in two rows and two columns. A predetermined number of memory cells among the memory cells arranged in a column are coupled to a sub-bit line SBL. In FIG. 27, memory cells MC11 and MC21 are connected to a sub-bit line SBL1, and memory cells MC12 and MC22 are connected to a sub-bit line SBL2.

A word line WL is arranged for the memory cells arranged in a row. In FIG. 27, memory cells MC11 and MC12 are connected to a word line WL1, and memory cells MC21 and MC22 are connected to a word line WL2.

A plurality of sub-bit lines arranged extending in the column direction and aligned in the same column. A sub-source line SSL1 commonly connecting the sources of memory cells MC11, MC21, . . . is provided corresponding to sub-bit line SBL1. Likewise, a sub-source line SSL2 commonly connecting the sources of memory cells 12, MC22, . . . is provided corresponding to sub-bit line SBL2. Sub-source lines SSL1 and SSL2 are connected to a source line SL via source-side block select transistors SGS1 and SGS2 receiving on their gates a source-side block select signal SS. Sub-bit lines SBL1 and SBL2 are connected respectively to main bit lines MBL1 and MBL2 via drain-side block select transistors SGD1 and SGD2 receiving on their gates a drain-side block select signal SD.

Main bit lines MBL1 and MBL2 each are arranged corresponding to a memory cell column and are connected to a plurality of sub-bit lines via the block select transistors receiving a drain-side block select signal. Brief description will now be given on operations of the nonvolatile semiconductor memory device shown in FIG. 27.

Referring first to FIG. 28, an operation for writing data into memory cell MC11 will be described. In this case, drain-side block select signal SD is set to H-level, and drain-side block select transistors SGD1 and SGD2 are set to the on state. Further, source-side block select signal SS is set to L-level, and source-side block select transistors SGS1 and SGS2 are set to the off state so that sub-bit lines SSL1 and SSL2 are electrically floated. Word line WL1 is supplied with a programming high voltage Vhh. Unselected word line WL2 maintains L-level. Main bit line MBL1 is supplied with a voltage at the ground voltage level of L-level. Main bit line MBL2 is supplied with a program inhibiting voltage Vh (<Vhh).

In memory cell MC11, the drain is connected to sub-bit line SBL1, and is set to the ground voltage level, the source thereof is connected to sub-source line SSL1, and electrically floated, and the control gate is connected to word line WL1, and receives programming high voltage Vhh. In this state, memory cell MC11 is in such a state that a Fowler-Nordheim tunneling current (F-N tunneling current) flows from a drain region to a floating gate, and electrons are accumulated in the floating gate so that the threshold voltage rises. This state in which threshold voltage Vth is raised is called a "programmed state".

In memory cell MC12, the drain receives program inhibiting voltage Vh transmitted onto sub-bit line SBL2. In this state, memory cell MC12 is in such a state that a voltage difference (Vhh–Vh) between the drain and the control gate is low, and F-N tunneling current does not flow so that electrons are not injected into the floating gate, and programming of data into memory cell MC is not performed.

This state wherein the programming is not performed corresponds to a state wherein the threshold voltage Vth is low.

Now, a data read operation will now be described with reference to FIG. 29. In the following description, it is assumed that stored information is read out from memory cells MC11 and MC12, which are in the programmed state (high threshold voltage state (Hi-Vth state)) and the non-programmed state (low threshold voltage state (Low-Vth state)), respectively. In this case, drain-side block select signal SD is set to H-level, and drain-side block select transistors SGD1 and SGD2 are turned on so that sub-bit lines SBL1 and SBL2 are electrically connected to main bit lines MBL1 and MBL2, respectively. The source-side block select signal SS is set to H-level, and source-side select transistors SGS1 and SGS2 are turned on so that sub-source lines SSL1 and SSL2 are connected to source line SL. Source line SL is set to ground voltage GND level.

Word line WL1 is supplied with a read voltage Vr intermediate the high and low threshold voltages Hi-Vth and Low-Vth. Main bit lines MBL1 and MBL2 are supplied with a precharge voltage Vp, and sub-bit lines SBL1 and SBL2 are precharged to precharge voltage Vp level via drain-side block select transistors SGD1 and SGD2.

Since memory cell MC11 is in the high threshold voltage state, and has the threshold voltage higher than read voltage Vr, memory cell MC11 maintains the off state, and sub-bit line SBL1 maintains the voltage level of precharge voltage Vp. Memory cell MC12 is in the low threshold voltage state, and is turned on in accordance with read voltage Vr on word line WL1 so that a current flows from sub-bit line SBL2 via sub-source line SSL2 and source-side block select transistor SGS2 to source line SL at the ground voltage GND level, and the voltage level on sub-bit line SBL2 lowers.

Main bit lines MBL1 and MBL2 are provided with sense amplifier circuits, which in turn sense the changes in voltage level of precharge voltage Vp on main bit lines MBL1 and MBL2 (whether a current flows or not) for reading the data of memory cells. The output data of the sense amplifier circuits provided for main bit lines MBL1 and MBL2 is selected according to a column address signal depending on the output bit width of the nonvolatile semiconductor memory device, and the external reading of the memory cell data is performed.

In the foregoing nonvolatile semiconductor memory device, the memory cell of one bit is formed of one transistor (stacked gate type MOS (insulated gate type field effect) transistor) so that an area occupied by one bit of the memory cell can be small, and the memory cell structure is suitable to high-density integrationization.

FIG. 30 schematically shows a planar layout of the memory cell array shown in FIG. 27. In FIG. 30, N-type impurity diffusion layers 1-1 and 1-2 forming sub-source lines SBL1 and SBL2 are arranged in the column direction. N-type impurity diffusion layers 2-1 and 2-2 extending in the column direction and forming sub-source lines SSL1 and SSL2 are arranged alternately with impurity diffusion layers 1-1 and 1-2. Impurity diffusion layers 1-1 and 1-2 are coupled to impurity regions of drain-side block select transistors SGD1 and SGD2 shown in FIG. 27. Likewise, impurity diffusion layers 2-1 and 2-2 are coupled to impurity regions of source-side block select transistors SGS1 and SGS2 shown in FIG. 27.

Conductive layers 3-0–3-n which form word lines WL1–WLn, respectively, are arranged in the direction perpendicular to impurity diffusion layers 1-1, 1-2, 2-1 and 2-2. These conductive layers 3-0–3-n are formed of, e.g., a second level polycrystalline silicon layer.

A low resistance conductive layer 4 extending in the row direction for transmitting drain-side block select signal SG is arranged crossing drain-side block select transistors SGD1 and SGD2. A low resistance conductive layer 5 for transmitting source-side block select signal SS is arranged crossing source-side block select transistors SGS1 and SGS2. A low resistance conductive layer 6 forming source line SL is arranged parallel to conductive layer 5.

Conductive layer 4 functions as gates of drain-side block select transistors SGD1 and SGD2, and conductive layer 5 functions as gates of source-side block select transistors SGS1 and SGS2. The source-side impurity regions of source-side block select transistors SGS1 and SGS2 are electrically coupled to conductive layer 6 forming source line SL through contact holes 8c and 8d, respectively. The impurity regions of drain-side block select transistors SGD1 and SGD2 are electrically connected to low resistance conductive layers 7-1 and 7-2 forming main bit lines MBL1 and MBL2 through contact holes 8a and 8b, respectively. Low resistance conductive layers 7-1 and 7-2 forming main bit lines MBL1 and MBL2 extend in the column direction and are arranged in the direction crossing conductive layers 4, 5 and 6. Low resistance conductive layers 7-1 and 7-2 forming main bit lines MBL1 and MBL2 are formed of an interconnection layer higher than conductive layers 4, 5 and 6.

FIG. 31 schematically shows a sectional structure of memory cell MC. Memory cell MC includes heavily doped N-type impurity regions (N-type impurity diffusion layers) 1 and 2 formed at the surface of a P-type semiconductor substrate region 9, a conductive layer 10 formed on a channel region between impurity diffusion regions 1 and 2 and forming a floating gate FG, and conductive layer 3 formed on conductive layer 10 and forming word line WL. Conductive layer 10 forming floating gate FG as well as conductive layer 3 forming word line WL are formed, e.g., of first and second level polycrystalline silicon interconnection layers.

Above conductive layer 3 forming the word line, there is arranged a low resistance conductive layer 7 formed of, e.g., a first level aluminum interconnection layer and forming main bit line MBL. Impurity diffusion layers 1 and 2 are arranged commonly to a predetermined number (n) of memory cells arranged along the column direction. The channel regions of the memory cells in adjacent rows are isolated from each other by an impurity region (not shown). More specifically, field insulating films are formed between word lines WL1–WLn in FIG. 30. Even in the structure wherein the impurity diffusion layer forming the source and drain of each memory cell extends commonly to the plurality of memory cells, each memory cell can individually perform the information storage and data reading in accordance with the signal potential on a corresponding word line WL (WL1–WLn).

As shown in FIGS. 30 and 31, the diffusion layer is utilized for sub-bit line SBL and sub-source line SSL, whereby the following advantages can be provided. If the sub-bit line and sub-source line are formed of, e.g., aluminum interconnection lines, it would be necessary to form contact holes connecting the drain and source of memory cell MC to the first level aluminum interconnection lines forming the sub-bit line and sub-source line, respectively. Therefore, a region for forming the contact holes would be required for every memory cell, resulting in increase in area occupied by the memory cells. By utilizing the diffusion layer as sub-bit line SBL and sub-source line SSL, such contact holes are not required, and the area occupied by the memory cells can be reduced.

If sub-bit line SBL and sub-source line SSL are formed of the first level aluminum interconnection line, main bit line MBL must be formed of an interconnection line at a higher level such as a second level aluminum interconnection line. In this case, the impurity regions (impurity diffusion layers) of the drain-side block select transistors SGD1 and SGD2 are distant from main bit line MBL so that a region for making the contact increases (e.g., a filling plug is required), and the area occupied by the drain-side block select transistors would be increased. By employing such a structure that sub-bit line SBL and sub-source line SSL are formed of the impurity diffusion layer instead of the metal interconnection layer, main bit line MBL can be formed of, e.g., the first level aluminum interconnection layer, whereby it is possible to reduce an area occupied by the contact region between the main bit line and the impurity region of the drain-side block select transistor, and an area occupied by the drain-side block select transistors can be reduced. Thus, the memory cell array area can be reduced, and it is possible to provide the nonvolatile semiconductor memory device having a highly integrated, high-density structure.

FIG. 32 schematically shows a structure of memory cells of two bits arranged in the row direction. In FIG. 32, N-type impurity regions (impurity diffusion layers) 1a, 2a, 1b and 2b are formed at the surface of semiconductor substrate region 9. Between impurity diffusion layers 2a and 1b, there is formed a cell isolating film 11 formed of, e.g., a filed insulating film. A conductive layer 10a forming a floating gate (FG) is formed on the surface of substrate region 9 between impurity regions 1a and 2a, and a conductive layer 10b forming the floating gate is formed on a channel region between impurity regions 1b and 2b. Conductive layer 3 extending in the row direction to form word line WL is formed on conductive layers 10a and 10b forming the floating gates. Conductive layers 7a and 7b extending in the column direction to form main bit lines MBL are formed on conductive layer 3 forming word line WL.

The pitch of memory cells MC in the column direction can be reduced in accordance with the design size. It is merely required to achieve a sufficiently small sheet resistance of impurity diffusion layers 1a, 2a, 1b and 2b to provide a sufficiently small delay in signal transmission on these impurity layers as well as a sufficiently small voltage distribution.

However, main bit line MBL is a metal interconnection line formed above the surface of semiconductor substrate region 9, and is required to have a sufficient immunity against to a stress applied, e.g., from an interlayer insulating film, so that main bit line MBL must have a certain line width. For reducing an inter-line capacitance, a minimum value exists in inter-line distance between conductive layers 7a and 7b forming main bit lines MBL.

Further, as shown in FIG. 30, conductive layers 7a and 7b forming the main bit lines must be connected electrically to drain-side select transistors (SGD1 and SGD2) formed thereunder via contact holes 8a and 8b, respectively. Since the metal interconnection line forming the main bit line is far distant from the impurity diffusion layer at the surface of semiconductor substrate region 9, a relatively large contact region is required for making an electrical contact between conductive layers 7a and 7b forming the main bit lines and the impurity diffusion layers at the lower layer. This is because the contact resistance must be reduced, and the contact hole region must be precisely filled with a conductive material. Accordingly, as shown in FIG. 30, conductive layers 7-1 and 7-2 forming main bit lines MBL1 and MBL2 have increased line widths in the regions of contact holes 8a and 8b, respectively, and thereby the region for reliable contact is insured. A pitch of these contact regions must be ensured. Due to the above facts, the pitch of the main bit lines is, larger than the pitch in the row direction of the memory cells (i.e., pitch between the memory cells in the adjacent columns), so that the pitch of the memory cells in the row direction is restricted by the pitch of the main bit lines even if the memory cells have miniaturized structures, and therefore the memory cell area cannot be reduced.

SUMMARY OF THE INVENTION

An object of the invention is to provide a nonvolatile semiconductor memory device, in which a memory cell area can be reduced without an influence by a pitch condition of the main bit lines.

Another object of the invention is to provide a nonvolatile semiconductor memory device, in which a memory cell array area in the row direction can be significantly reduced. In summary, in a nonvolatile semiconductor memory device according to the invention, one main bit line is arranged for a plurality of columns of sub-bit lines Since one main bit line is arranged for the sub-bit lines arranged corresponding to a plurality of columns, the pitch condition of the main bit lines can be relaxed, and the pitch of the memory cells in the row direction is not affected by the pitch condition of the main bit lines even if the memory cells are arranged at the sub-bit line pitches. Accordingly, the memory cell array can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
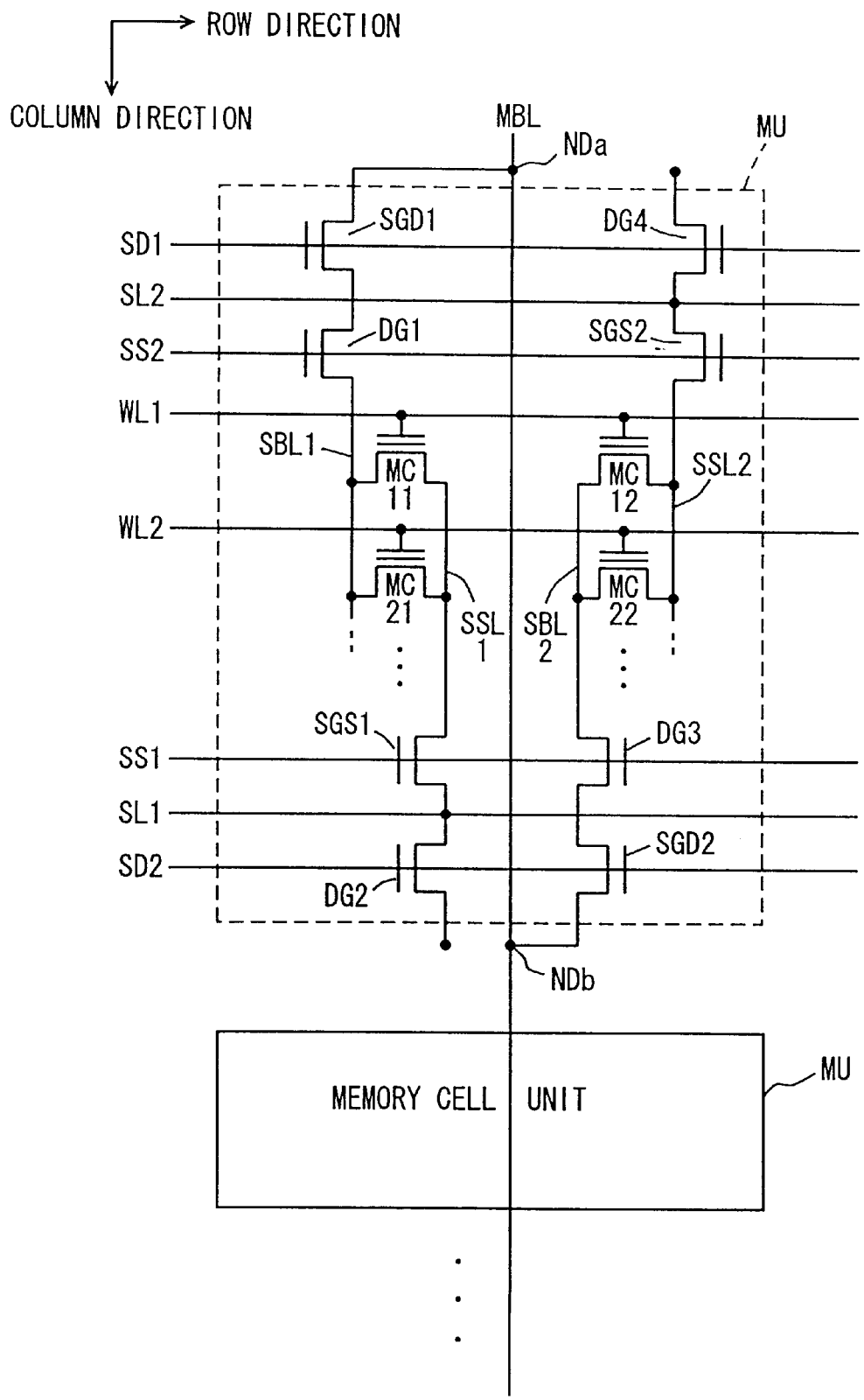
FIG. 1 shows a structure of a memory cell unit according to a first embodiment of the invention.

FIG. 1 shows a structure of a main portion of a nonvolatile semiconductor memory device according to a first embodiment of the invention. In FIG. 1, memory cell units MU each including memory cells MC arranged in a plurality of columns are arranged in rows and columns. A main bit line MBL extending in the column direction is arranged commonly to the plurality of memory cell units MU aligned in the column direction. FIG. 1 shows representatively only one memory cell unit MU.

Memory cell unit MU includes sub-bit lines SBL1 and SBL2 connected respectively to memory cells MC arranged in different columns. Each of sub-bit lines SBL1 and SBL2 is connected to n (n≧2) memory cells MC. FIG. 1 shows representatively memory cells MC11 and MC21 connected to sub-bit line SBL1 as well as memory cells MC12 and MC22 connected to sub-bit line SBL2.

The sources of memory cells MC11 and MC21 are commonly connected to sub-source line SSL1, and the sources of memory cells MC12 and MC22 are commonly connected to sub-source line SSL2. Sub-bit lines SBL1 and SBL2 as well as sub-source lines SSL1 and SSL2 are formed of an impurity diffusion layer (impurity region), as will be described later.

Control gates of memory cells MC11 and MC12 arranged alignedly in the row direction are connected to word line WL1, and control gates of memory cells MC21 and MC22 are connected to word line WL2. Each of word lines WL1 and WL2 is connected to memory cells MC arranged in a single row.

Sub-bit line SBL1 is electrically connected to a node NDa on main bit line MBL via a drain dummy transistor DG1 receiving source-side block select signal SS2 on its gate and a drain-side block select transistor SGD1 receiving drain-side block select signal SD1 on its gate.

Sub-source line SSL1 is connected to a source line SL1 via source-side block select transistor SGS1 made conductive in response to source-side block select signal SS1. This source line SL1 is connected to a source-sidedummy transistor DG2 made conductive on in response to a drain-side block select signal SG2. One conduction node (drain) of dummy transistor DG2 is set to the open state.

Sub-bit line SBL2 is electrically coupled to a node NDb on main bit line MBL via a drain-side dummy transistor DG3 receiving source-side block select signal SS1 on its gate and a drain-side block select transistor SGD2 receiving drain-side block select signal SD2 on its gate.

Sub-source line SSL2 is connected to a source line SL2 via source-side block select transistor SGS2 made conductive in response to source-side block select signal SS2. This source line SL2 is connected to a source-side dummy transistor DG4 receiving a drain-side block select signal SG1 on its gate. One conduction node (drain) of dummy transistor DG4 is set to the open state. With no channel resistance of the dummy transistor, a resistance between the sub-source line and the source line can be small.

These dummy transistors DG1–DG4 are employed so that sub-bit lines SBL1 and SBL2 may have the same electric characteristics (parasitic resistance and parasitic capacitances) and sub-source lines SSL1 and SSL2 may have the same electric characteristics. Owing to these dummy transistors DG1–DG4, the layout of transistors in memory cell unit MU can be symmetrical with respect to main bit line MBL, so that the layout can be made simple, and an influence by misalignment of a mask in a manufacturing process can be cancelled. By arranging the source line between the source select signal lines, the size of the unit in the column direction can be reduced.

Owing to the arrangement that drain-side block select transistors SGD1 and SGD2 are connected to nodes NDa and NDb opposite with respect to memory cell unit MU, respectively, it is possible to simplify a layout of source lines SL1 and SL2 as well as signal lines transmitting drain block select signals SD1 and SD2 as well as source block select signals SS1 and SS2. Description will now be given on operations of programming, reading and erasing data with respect to memory cell unit MU shown in FIG. 1.

Figure 2A:
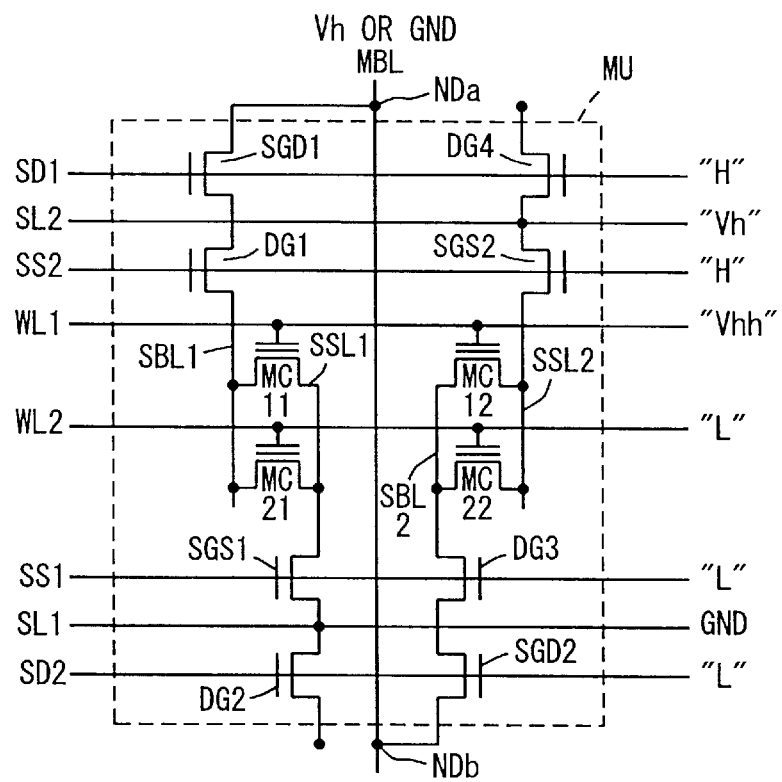
FIGS. 2A and 2B show applied voltage levels during data programming.

FIG. 2A shows applied voltages during an operation of programming data into memory cell MC11. In this data programming operation, sub-bit lines SBL1 and SBL2 are successively selected. In the operation of programming data into memory cell MC11 connected to sub-bit line SBL1, drain-side block select signal SD1 and source-side block select signal SS2 are set to H-level, and drain-side block select transistor SGD1 and dummy transistor DG1 are driven to the on state. Concurrently, source-side block select transistor SGS2 and dummy transistor DG4 are driven to the on state.

Source-side block select signal SS1 and drain-side block select signal SD2 are both set to L-level, and source-side block select transistor SGS1 and drain-side block select transistor SGD2 as well as dummy transistors DG2 and DG3 are set to the off state. Source line SL2 is supplied with program inhibiting voltage Vh, and source line SL1 maintains ground voltage GND level. Word line WL1 is supplied with a programming high voltage Vhh higher than program inhibiting voltage Vh.

In this state, program inhibiting voltage Vh or ground voltage GND is transmitted onto main bit line MBL in accordance with the write data. When ground voltage GND is transmitted from main bit line MBL onto sub-bit line SBL1, memory cell MC11 has electrons injected from the drain into the floating gate owing to the F-N tunneling current, and is set to a high threshold voltage state. For the unselected memory cell MC12 connected to word line WL1, sub-source line SSL2 is supplied with program inhibiting voltage Vh via source-side block select transistor SGS2, and sub-bit line SBL2 is electrically floated. Thus, the F-N tunneling current does not flow from sub-source line SSL2 to the floating gate of memory cell MC12, and programming is not carried out on this memory cell MC12.

When main bit line MBL is supplied with program inhibiting voltage Vh, program inhibiting voltage Vh is transmitted onto sub-bit line SBL1. In memory cell MC11, therefore, the F-N tunneling current does not flow, and programming is not performed. This is the same as the situation in which programming into unselected memory cell MC12 is inhibited.

Figure 2B:
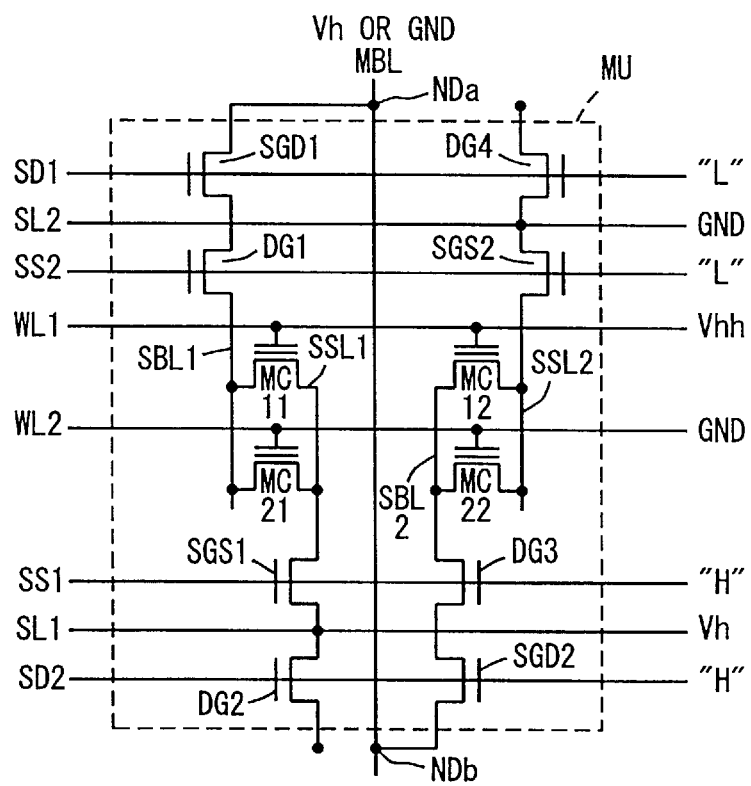

When programming into memory cell MC11 is completed, programming into memory cell MC12 connected to sub-bit line SBL2 is then performed. In this case, as shown in FIG. 2B, drain-side block select signal SD1 and source-side block select signal SS2 are both set to L-level, and source line SL2 is set to the ground voltage GND level. Source line block select signal SS1 and drain-side block select signal SD2 are set to H-level, and source line SL1 is set to the level of program inhibiting voltage Vh. Word line WL1 is supplied with programming high voltage Vhh higher than program inhibiting voltage Vh.

In this state, sub-bit line SBL2 is connected to main bit line MBL via dummy transistor DG3 and drain-side block select transistor SGD2. Source-side block select transistor SGS2 is off, and sub-source line SSL2 is in the electrically floating state. When ground voltage GND is transmitted onto main bit line MBL, memory cell MC12 has the F-N tunneling current caused to flow from the drain region to the floating gate, and the threshold voltage thereof rises. Thus, memory cell MC12 is set to the high threshold voltage state. When main bit line MBL is supplied with program inhibiting voltage Vh, the F-N tunneling current does not flow in memory cell MC12, and the programming is not performed therein.

In the unselected memory cell MC11, sub-bit line SBL1 is in the electrically floating state, and sub-source line SSL1 receives program inhibiting voltage Vh via source-side block select transistor SGS1. Therefore, the F-N tunneling current does not flow, and programming is not performed in memory cell MC11.

Accordingly, even in the structure wherein one main bit line is connected to two sub-bit lines SBL1 and SBL2, programming into selected memory cells can be reliably performed by successively connecting sub-bit lines SBL1 and SBL2 to the main bit line, and setting the voltage level of the sub-source line in the unselected state to the program inhibiting voltage level. In this case, programming into memory cell MC is inhibited by transmitting program inhibiting voltage Vh to the sub-source line. This is because the sources and drains of the memory cell transistors are formed into a symmetrical form.

Figure 3:
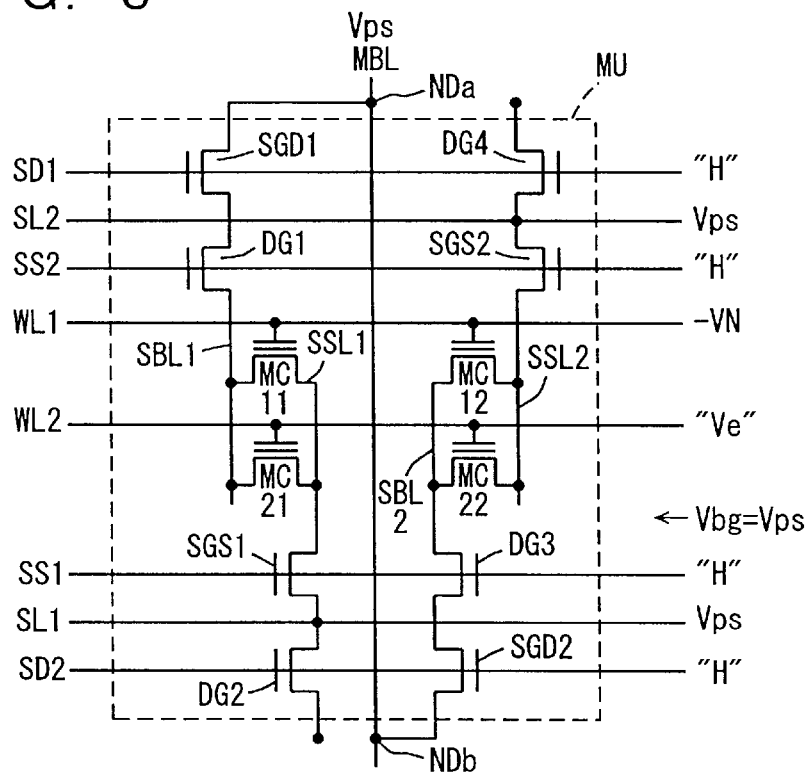
FIG. 3 shows applied voltage levels during an erasing operation of the memory cell unit shown in FIG. 1.

FIG. 3 shows applied voltages during an erasing operation. As shown in FIG. 3, the erasing operation is executed a word line at a time or a sector at a time. In this erasing operation, a negative voltage of −VN is applied to selected word line WL1. Unselected word line WL2 is supplied with an erase inhibiting voltage Ve. Signals SD1, SD2, SS1 and SS2 are set to H-level. Main bit line MBL and source lines SL1 and SL2 are supplied with a positive voltage Vps. Signals SD1, SD2, SS1 and SS2 are set to a voltage level allowing transmission of this positive voltage Vps. Memory cell transistors MC11–MC22 receive on their back gates (substrate regions) positive voltage Vps as a substrate bias voltage Vbg. Therefore, sub-bit lines SBL1 and SBL2 as well as sub-source lines SSL1 and SSL2 are supplied with positive voltage Vps.

In memory cells MC11 and MC12, word line WL1 carries a negative voltage −VN, and the source/drain and back gates are at a level of positive voltage Vps. In memory cells MC11 and MC12, electrons are ejected from the floating gate to the source, drain and back gate in accordance with the voltage difference (Vps+VN), and the low threshold voltage state is set. In memory cells MC21 and MC22, word line WL2 is at the level of erase inhibiting voltage Ve, and electrons are not ejected from the floating gate. Thereby, erasing is performed a sector at a time. The erasing may be performed a block at a time.

Figure 4:
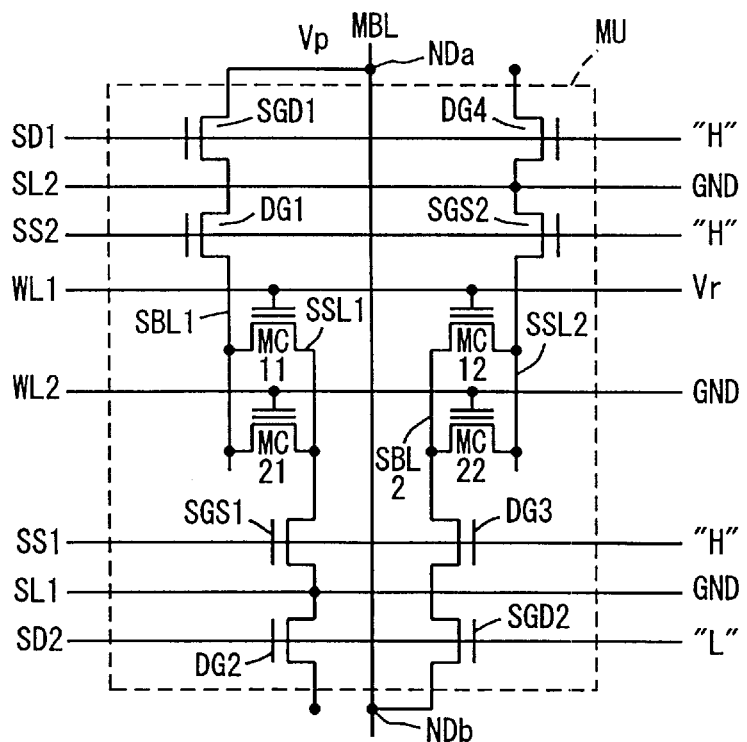
FIG. 4 shows applied voltage levels during data reading of the memory cell unit shown in FIG. 1.

Referring to FIG. 4, an operation for data reading will now be described.

FIG. 4 shows the voltages applied when data is read from memory cell MC11 connected to sub-bit line SBL1. For reading data from memory cell MC11, both signals SD1 and SD2 are set to H-level, and source lines SL2 and SL1 are set to ground voltage GND level. Further, source-side block select signal SS1 is set to H-level. Main bit line MBL is supplied with precharge voltage Vp during data reading. Word line WL1 is supplied with a read voltage Vr intermediate the low and high threshold voltages. Word line WL2 is held at ground voltage GND level.

In this state, transistors SGD1 and DG1 are turned on, and sub-bit line SBL1 is connected to main bit line MBL. Sub-source line SSL1 is connected to source line SL1 via transistor SGS1. Since transistor SGD2 is off, sub-source line SBL2 is held in the electrically floating state.

When memory cell MC11 is in the low threshold voltage state, a current flows from sub-bit line SBL1 to source line SL1 via sub-source line SSL1, and the level of precharge voltage Vp changes (or a current flows). Data reading is performed by detecting a change in-voltage or a change in current on main bit line MBL. When memory cell MC11 is in the high threshold voltage state, memory cell MC11 is off, and sub-bit line SBL1 maintains the voltage level of precharge voltage Vp. By detecting whether the voltage or current on main bit line MBL changes or not, the data reading is performed.

In memory cell MC12, sub-source line SSL2 is held at the ground voltage level, but sub-bit line SBL2 is electrically floated so that no influence is exerted on the operation of reading data from memory cell MC MC11.

For data reading from memory cell MC12, drain-side block select signals SD1 and SD2 are set to L- and H-levels, respectively. Sub-bit line SBL2 is connected to main bit line MBL, and sub-bit line SBL1 is set to the electrically floating state. The current flows or does not flow on main bit line MBL depending on the storage data of memory cell MC12, whereby the data reading is performed. When one word line WL1 corresponds to one sector, the data of sub-bit lines SBL1 and SBL2 are successively read out while word line WL1 is in the selected state.

Figure 5:
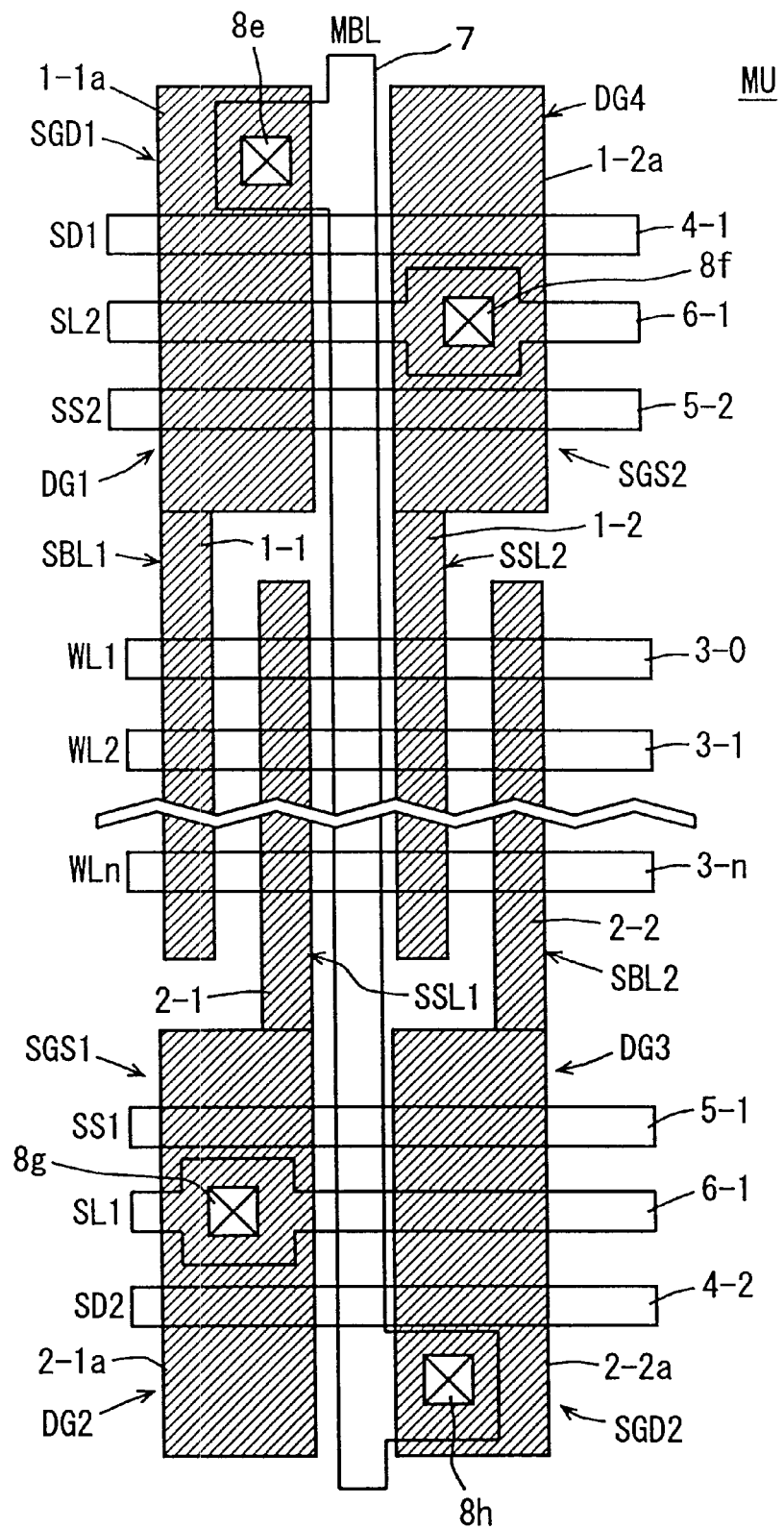
FIG. 5 schematically shows a planar layout of the memory cell unit shown in FIG. 1.

FIG. 5 schematically shows a planar layout of memory cell unit MU shown in FIG. 1. In FIG. 5, memory cell unit MU is comprised of an impurity diffusion layer 1-1 forming sub-bit line SBL1, an impurity diffusion layer 2-1 forming sub-source line SSL1, an impurity diffusion layer 1-2 forming sub-source line SSL2 and an impurity diffusion layer 2-2 forming sub-source line SBL2. These diffusion layers all extend in the column direction. These impurity diffusion layers 1-1, 1-2, 2-1 and 2-2 are formed of heavily doped N-type impurity regions, respectively. Impurity diffusion regions 1-1 and 1-2 have row-directional widths increased in regions 1-1*a* and 1-2*a* for forming select transistors, respectively. Likewise, impurity diffusion layers 2-1 and 2-2 have row-directional widths increased in regions 2-1*a* and 2-2*a* for forming select transistors, respectively.

Perpendicularly to impurity regions 1-1*a* and 1-2*a*, there are arrranged conductive layers 4-1, 6-1 and 5-2 extending in the row direction and formed of, e.g., metal interconnection lines. Conductive layer 4-1 transmits drain-side block select signal SD1, conductive layer 6-1 forms source line SL2, and conductive layer 5-2 transmits source-side block select signal SS2. In regions where conductive layers 4-1 crosses impurity regions 1-1*a* and 1-2*a*, select transistor SGD1 and dummy transistor DG4 are formed, respectively. Likewise, dummy transistor DG1 and select transistor SGS2 are formed in regions where conductive layer 5-2 crosses impurity regions 1-1*a* and 1-2*a*.

Conductive layers 5-1, 6-1 and 4-2 extend in the row direction, and cross impurity regions 2-1*a* and 2-2*a*. Conductive layer 5-1 transmits source-side block select signal SS1, conductive layer 6-1 forms source line SL1, and conductive layer 4-2 transmits drain-side block select signal SD2. In regions where conductive layers 4-2 crosses impurity regions 2-1*a* and 2-2*a*, source-side block select transistor SGS1 and dummy transistor DG3 are formed, respectively. Likewise, dummy transistor DG2 and drain-side block select transistor SGD2 are formed in regions where conductive layer 4-2 crosses impurity regions 2-1*a* and 2-2*a*.

Conductive layers 3-0, 3-1, . . . , 3-n forming word lines WL1, WL2, . . . , WLn are arranged crossing impurity diffusion regions 1-1 and 1-2.

Conductive layer 7 forming main bit line MBL is arranged extending in the column direction perpendicular to conductive layers 3-0–3-n forming the word lines. Conductive layer 7 is arranged perpendicular to conductive layers 4-1, 4-2, 5-1, 5-2, 6-1, 6-2 and 3-0–3-n, and is formed of an interconnection line (e.g., first level aluminum interconnection line) located above these layers. Conductive layer 7 is connected to impurity region 1-1*a* via contact hole 8*e*, and conductive layer 6-1 is electrically connected to impurity region 2-1a via contact hole 8f. Impurity region 2-1a is connected to conductive layer 6-1 via contact hole 8g, and conductive layer 7 is electrically connected to impurity region 2-2a via contact hole 8h.

Owing to provision of dummy transistors DG1–DG4 as shown in FIG. 5, the impurity diffusion layers in the respective columns of memory cell unit MU can have the same layout except for only the positions of contact holes. Therefore, the pattern layout can be simple.

The memory cells disposed in two columns can be arranged corresponding to one main bit line MBL, and the pitch of main bit lines MBL can correspond to the pitch of two memory cells so that the memory cells can be reduced in size without an influence by the pitch condition of main bit lines MBL.

The layout of memory cell unit MU shown in FIG. 5 is repeated in the row and column directions. The impurity diffusion layer does not exist, but the channel region of the transistor is formed in each of the crossing regions where conductive layers 4-1, 6-1 and 5-2 cross impurity regions 1-1a and 1-2a. Likewise, the impurity diffusion layer does not exist in the regions where conductive layers 4-2, 6-2 and 5-1 cross impurity regions 2-1a and 2-2a.

Figure 6:
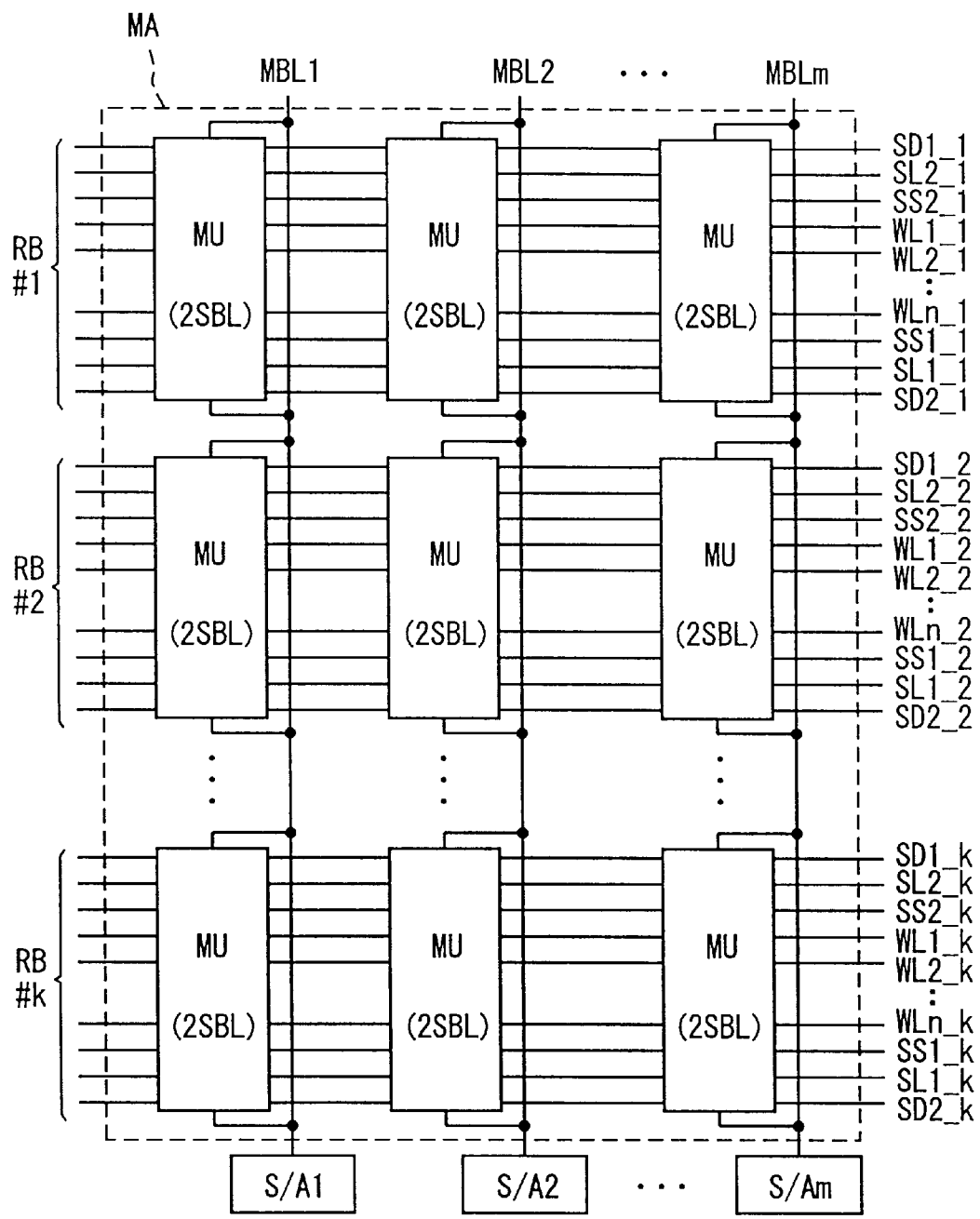
FIG. 6 schematically shows a structure of an array of the nonvolatile semiconductor memory device according to the first embodiment of the invention.

FIG. 6 shows a schematic structure of the memory array. In FIG. 6, memory array MA includes memory cell units MU arranged in rows and columns. As already described, memory cell unit MU includes two sub-bit lines SBL. Memory cell units MU aligned in the row direction form a row block RB. In FIG. 6, memory cell array MA is divided into k row blocks RB#1–RB#k. Each of row blocks RB#1–RB#k is provided with n word lines WL1–WLn. In the row block including a selected word line (i.e., in a selected row block), drain-side block select signals SD1 and SD2 as well as source block select signals SS1 and SS2 are driven to the selected state.

The voltage levels of source lines SL1 and SL2 are controlled on a row block basis. It is necessary to transmit program inhibiting voltage Vh onto the sub-source line during data programming, and it is also necessary in the erasing operation to apply the erasing voltage Vps onto the sub-source line. These source lines SL1 and SL2 are set to the required voltage levels only for the selected block, whereby the power consumption can be reduced.

For main bit lines MBL1–MBLm, there are arranged sense amplifier circuits S/A1–S/Am for data reading, respectively. The number of main bit lines MBL1–MBLm is equal to half the number of memory cell columns in memory cell array MA, and therefore the number of sense amplifier circuits can be reduced by half, compared with a conventional structure in which the main bit lines are arranged corresponding to the respective columns. Therefore, an area required by the sense amplifier circuits can be reduced.

The source lines are divided, and the numbers of the source-side block select signals and the drain-side block select signals must be increased in accordance with the number of the sub-bit lines included in the memory cell unit, so that the interconnection area increases. By increasing the number of word lines WL included in one row block, however, it is possible to suppress the increase in interconnection area due to division of the sub-bit lines and source lines, as well as the increase in area of the transistor arranging region caused by arrangement of the dummy transistors.

Figure 7:
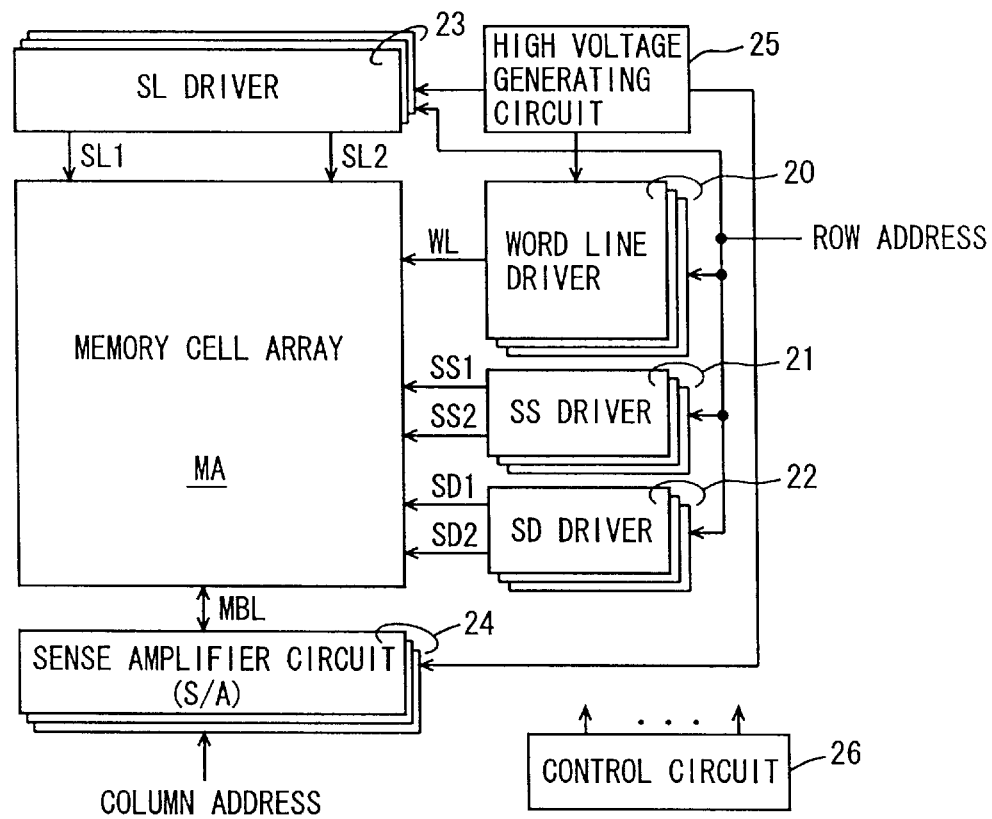
FIG. 7 schematically shows a whole structure of the nonvolatile semiconductor memory device according to the first embodiment of the invention.

FIG. 7 schematically shows a whole structure of a nonvolatile semiconductor memory device according to the first embodiment of the invention. As described above, memory cell array MA includes a plurality of memory cell units arranged in rows and columns. A word line driver group 20 includes word line drivers provided corresponding to respective row blocks of memory cell array MA for driving an addressed row to the selected state in accordance with a row address signal. An SS driver group 21 includes SS drivers provided corresponding to the respective row blocks of memory cell array MA for driving the source-side block select signals SS1 and SS2 of the corresponding row blocks in accordance with the row address signal. An SD driver group 22 includes SD drivers provided corresponding to the respective row blocks of memory cell array MA for driving the drain-side block select signals SD1 and SD2 of the corresponding row blocks. An SL driver group 23 includes SL drivers provided corresponding to the respective row blocks of memory cell array MA for setting the voltages on source lines SL1 and SL2 of the corresponding row blocks in accordance with the row address signal. A sense amplifier circuit group 24 includes sense amplifier circuits (S/A) provided corresponding to main bit lines MBL of memory cell array MA, respectively. A high voltage generating circuit 25 generates required high voltages in the programming and erasing operations, and a control circuit 26 controls the operations of these circuits in accordance with an operation mode.

High voltage generating circuit 25 applies a high voltage to SL driver group 23, word line drive group 20 and sense amplifier circuit group 24. Since high voltage Vps must be applied to main bit line MBL in the erase operation, high voltage generating circuit 25 applies the high voltage to sense amplifier circuit 24 as described above. In the data programming operation, a write circuit (not shown) applies the write data to each main bit line MBL, and the write data is latched in each main bit line MBL. In the actual data programming operation, the ground voltage or programming inhibiting voltage Vh depending on the latched data is applied onto the corresponding main bit line.

As described above, high voltage generating circuit 25 also applies the high voltage to SL driver group 23 for applying the erasing high voltage Vps onto source lines SL1 and SL2. Word line drive group 20 is supplied with programming high voltage Vhh from high voltage generating circuit 25. During the erase operation, word line driver group 20 receives a negative voltage from a negative voltage generating circuit (not shown), and transmits the same onto a selected word line.

Which column of the memory cells is to be selected in one group of the memory cells connected to one main bit line MBL is identified in accordance with a row address signal. In the programming operation, the SS driver, SD driver and SL driver for the selected row block are activated in accordance with the row address signal, and produce the signal/voltage according to a designated operation mode under the control of control circuit 26. In the erase operation mode, SL driver group 23 transmits erase voltage Vpc (i.e., voltage for erase operation) to source lines SL1 and SL2. In this case, the address signal designating a row block is used in SL driver group 23. In SS driver group 21 and SD driver group 22, the SS driver and SD driver of the selected row block are activated during the erase operation mode so that the signals SS1, SS2, SD1 and SD2 for the selected row block are set to H-level.

In the programming operation mode, SL driver 23 for a selected row block in SL driver group 23 drives the select signal corresponding to a selected sub-bit line to the active state in accordance with the row address signal. In this operation, SL driver group 23, SS driver group 21 and SD driver group 22 may be controlled by control circuit 26 such that the sub-bit lines are selected in a predetermined sequence, that is, sub-bit lines SBL1 is selected, and then sub-bit line SBL2 is selected when the row address signal designates one word line.

Sense amplifier circuit group 24 is supplied with a column address signal, and the output signal of the sense amplifier circuit corresponding to the addressed column is externally read out via a read circuit (not shown).

According to the first embodiment of the invention, as described above, one main bit line is provided commonly to the sub-bit lines arranged corresponding to a plurality of different columns. Therefore, the number of main bit lines can be reduced to increase the pitch of main bit lines so that the memory cell area can be reduced without an influence of the pitch of the main bit lines.

[Second Embodiment]

Figure 8:
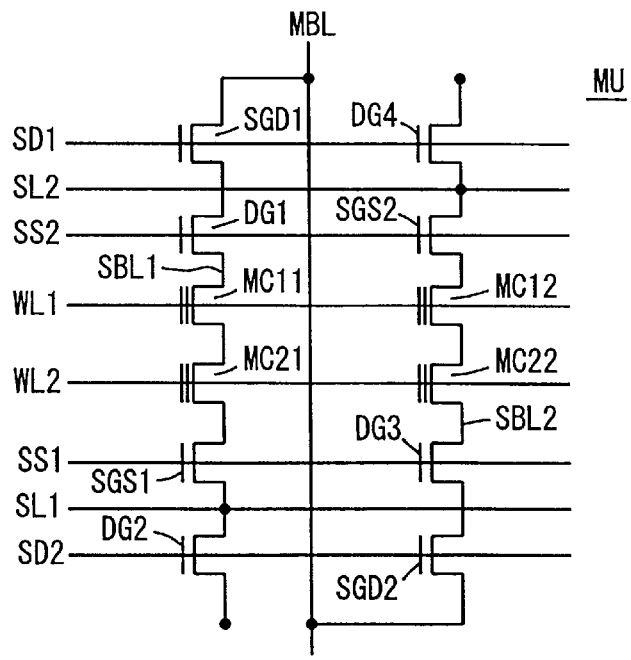
FIG. 8 shows a structure of a memory cell unit according to a second embodiment of the invention.

FIG. 8 shows an example of a structure of memory cell unit MU according to a second embodiment of the invention. In memory cell unit MU shown in FIG. 8, memory cells MC11 and MC21 are connected in series between sub-bit line SBL1 and a sub-source line, and memory cells MC22 and MC12 are connected in series between sub-bit line SBL2 and a sub-source line. Structures other than the above are the same as those shown in FIG. 1, and the corresponding portions bear the same reference characters.

Memory cell unit MU shown in FIG. 8 is usually called NAND-type cells. In the erase operation, word lines WL1 and WL2 are fixed to the ground voltage level, main bit line MBL and source lines SL1 and SL2 are supplied with an erase high voltage and the substrate region is supplied with an erase high voltage. In this state, a tunneling current flows from the floating gates of memory cells MC11, MC21, MC12 and MC22 to the substrate region, and the threshold voltage of these memory cells usually becomes negative. In an unselected memory cell in erasing, all the select signals are set to the erase high voltage level, and a potential difference is not present between the floating gate and the substrate region so that movement of electrons is inhibited.

In the data programming operation, a tunneling current is supplied from the drain region to the floating gate. In the case of programming of, e.g., memory cell MC11, a voltage (ground voltage or program inhibiting voltage) corresponding to the write data is transmitted onto main bit line MBL. Select signal SD1 is set to H-level (voltage level allowing transmission of the program inhibiting voltage), and block select signal SS2 is likewise set to H-level. Word line WL1 is set to the programming high voltage level, and word line WL2 is set to the program inhibiting voltage level. Block select signals SS1 and SD2 are set to L-level. In this state, a voltage corresponding to the write data for memory cell MC11 is transmitted from main bit line MBL to sub-bit line SBL1. When ground voltage GND is transmitted onto sub-bit line SBL1, electrons are injected from the drain into the floating gate so that the threshold voltage rises. In the case where the program inhibiting voltage is transmitted onto sub-bit line SBL1, the tunneling current does not flow, and data is not programmed into the memory cell.

In the data read operation, a selected word line is set to the ground voltage level, and an unselected word line is set to the normal read voltage level higher than the high threshold voltage. The source line is set to the ground voltage level. It is determined whether a current flows on the main bit line or not.

In the case of employing the NAND-type memory cell structure, the states of the block select signals in each operation mode are the same as those of the block select signals in the foregoing first embodiment. In the NAND-type memory cell structure shown in FIG. 8, each main bit line MBL can be arranged commonly to the memory cells arranged in two columns, whereby the pitch of the main bit lines can be increased, and the memory cell size in the column direction can be further reduced. Similarly to the first embodiment, it is possible to reduce the number of sense amplifier circuits connected to the main bit lines, and the area occupied by the circuits can be reduced, as can be done in the first embodiment.

FIG. 8 shows, by way of example, the memory cells arranged in two rows and two columns. In the NAND-type cell structure, the number of the memory cells connected to each sub-bit line SBL may be larger, e.g., 8 bits.

Sub-bit lines SBL1 and SBL2 as well as the sub-source lines in the structure shown in FIG. 8 are formed by regions where the source/drain impurity diffusion layers of the memory cell transistors continue to the impurity diffusion layers of the block select transistors.

[Third Embodiment]

Figure 9:
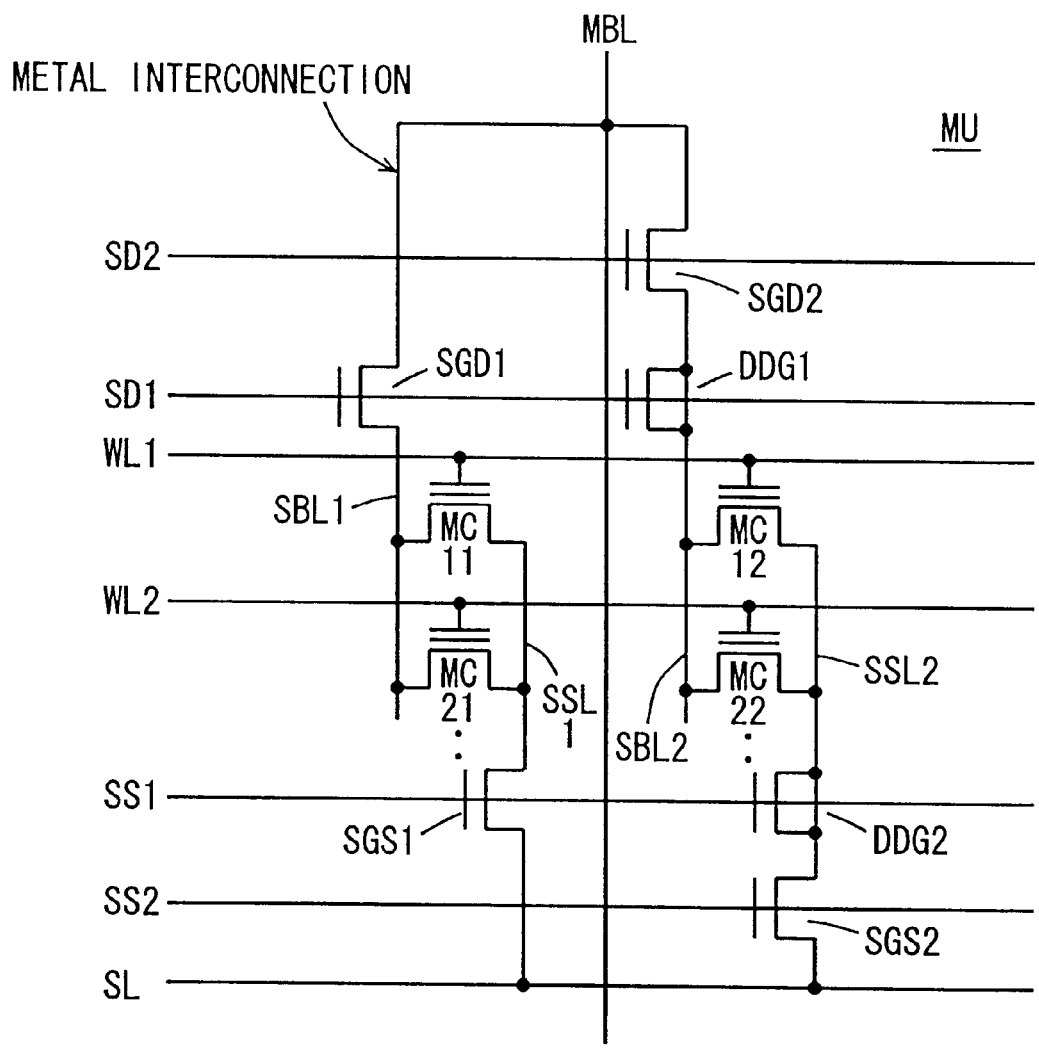
FIG. 9 shows a structure of a memory cell unit according to a third embodiment of the invention.

FIG. 9 shows a structure of memory cell unit MU according to a third embodiment of the invention. In memory cell unit MU shown in FIG. 9, each of bit lines SBL1 and SBL2 is likewise connected to n memory cells MC, but FIG. 9 shows representatively memory cells MC11 and MC21 connected to sub-bit line SBL1 as well as memory cells MC12 and MC22 connected to sub-bit line SBL2.

Memory cell unit MU shown in FIG. 9 includes a drain-side block select transistor SGD1 for connecting sub-bit line SBL1 to main bit line MBL in accordance with drain-side block select signal SD1, source-side block select transistor SGS1 for connecting sub-source line SSL1 to source line SL when made conductive in response to source-side block select signal SS1, drain-side block select transistor SGD2 for electrically connecting sub-bit line SBL2 to main bit line MBL in response to drain-side block select signal SD2, and source-side block select transistor SGS2 for connecting sub-source line SSL2 to source line SL in response to source-side block select signal SS2.

Sub-bit line SBL2 and sub-source line SSL2 are formed of impurity diffusion layers (impurity regions), and therefore an MOS transistor is inevitably formed in the crossing portion where the signal interconnection line transmitting drain-side block select signal SD1 crosses sub-bit line SBL2. An MOS transistor is also formed in the crossing portion between sub-source line SSL2 and the signal line transmitting source-side block select signal SS1. Each of MOS transistors DDG1 and DDG2 has a source and a drain short-circuited by a metal interconnection line, and set in the continuously on state. Accordingly, even if source line SL is arranged commonly to sub-bit lines SBL1 and SBL2 while eliminating an influence by these parasitic MOS transistors DDG1 and DDG2, the programming, erasing and reading of data can be accurately executed in accordance with the block select signal. Each operation will now be described.

Figure 10:
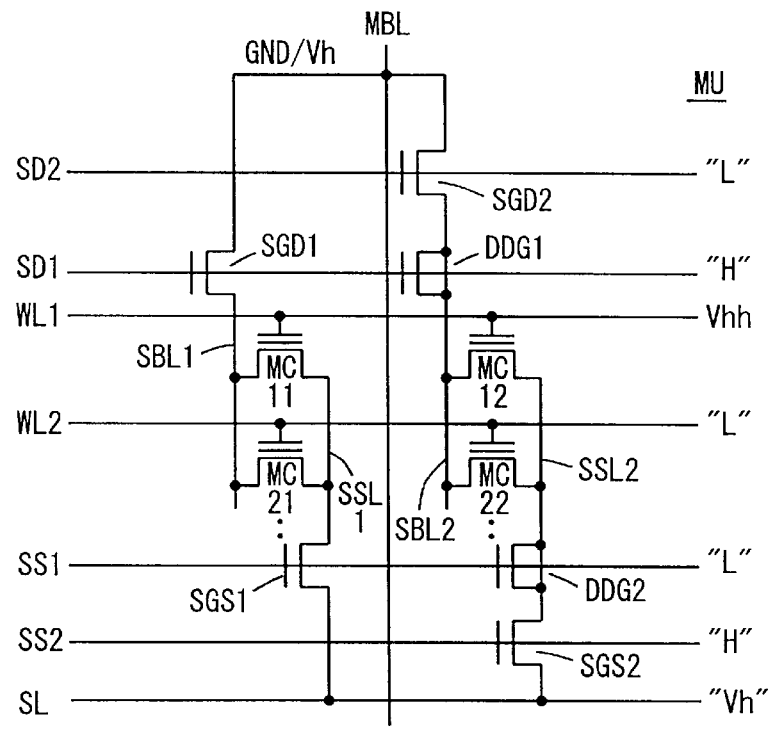
FIG. 10 shows applied voltage levels during data programming of the memory cell unit shown in FIG. 9.

FIG. 10 shows voltages on respective signal lines during data programming in memory cell unit MU according to the third embodiment of the invention. FIG. 10 shows the states of respective signals in the operation of programming data into memory cell MC11.

Drain-side block select signal SD1 is set to H-level, and block select transistor SGD1 is turned on to connect sub-bit line SBL1 to main bit line MBL. Source-side block select signal SS1 is set to L-level, and source-side block select transistor SGS1 is turned off to set sub-source line SSL1 to the electrically floating state. Word line WL1 is supplied with programming high voltage Vhh, and the unselected word line WL2 maintains the ground voltage level at L-level.

Drain-side block select signal SD2 is at L-level, and drain-side block select transistor SGD2 is turned off so that sub-bit line SBL2 is electrically floated. Source line SL is supplied with program inhibiting voltage Vh. Also, source-side block select signal SS2 is set to H-level so that program inhibiting voltage Vh on source line SL is transmitted onto sub-source line SSL2.

Sub-bit line SBL1 is supplied with ground voltage GND or program inhibiting voltage Vh in accordance with the write data. When sub-bit line SBL1 is at ground voltage GND level, the F-N tunneling current flows in memory cell MC11 and electrons flow from the floating gate into the drain region so that memory cell MC11 enters a high threshold voltage state. In the case where program inhibiting voltage Vh is transmitted onto sub-bit line SBL1, the tunneling current does not flow in this memory cell MC11, and the threshold voltage of memory cell MC11 does not change. In memory cell MC12, program inhibiting voltage Vh is transmitted onto sub-source line SSL2, and electrons do not move between the floating gate and the source in memory cell MC12.

For programming data into memory cell MC12 connected to sub-bit line SBL2, drain-side block select signal SD2 is set to H-level, and drain-side block select signal SD1 is set to L-level. Parasitic MOS transistor DDG1 has the drain and the source short-circuited by a metal interconnection line, so that main bit line MBL is connected to sub-bit line SBL2. Source-side block select signal SS1 is set to H-level, and source-side block select signal SS2 is set to L-level so that source-side block select transistor SGS2 is set to the off state. Program inhibiting voltage Vh is transmitted onto sub-source line SSL1. In this state, when ground voltage GND is transmitted onto sub-bit line SBL2 as data for memory cell MC12, memory cell MC12 attains a high threshold voltage state as a result of the tunneling current.

Figure 11:
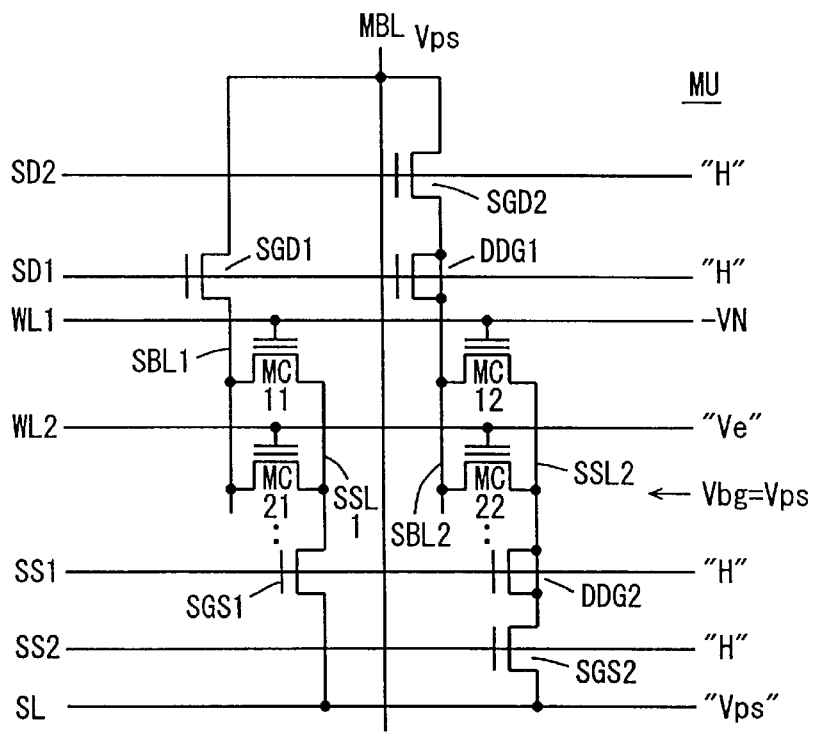
FIG. 11 shows applied voltage levels during an erasing operation of the memory cell unit shown in FIG. 9.

FIG. 11 shows the states of respective signals during an erase operation of memory cell unit MU according to the third embodiment of the invention. This erasing operation is executed a sector at a time, and erasing is performed in memory cells MC11 and MC12 connected to word line WL1 in FIG. 11. Main bit line MBL is supplied with positive voltage Vps, and source line SL is also supplied with positive voltage Vps. Block select signals SD1 and SD2 are set to H-level higher than this positive voltage Vps, and erase voltage Vps on main bit line MBL is transmitted onto sub-bit lines SBL1 and SBL2.

Source-side block select signals SS1 and SS2 are set to H-level higher than the erasing positive voltage Vps, and positive erase voltage Vps is transmitted onto sub-source lines SSL1 and SSL2. Positive voltage Vps is applied to the substrate region of memory cell unit MU as substrate bias voltage Vbg. Unselected word line WL2 is supplied with erase inhibiting voltage Ve for preventing erasing.

In this state, each of memory cells MC11 and MC12 has the source, drain and substrate region set to positive voltage Vps, and the control gate set to the negative voltage of $-VN$. In memory cells MC11 and MC12, therefore, electrons flow from the floating gates to the substrate regions in the tunneling current form, and these memory cells MC11 and MC12 attain the low threshold voltage state. This erasing operation is executed simultaneously on the memory cells connected to word line WL1. In memory cells MC21 and MC22 connected to word line WL2, the voltage level on word line WL2 is set to the voltage level of erase inhibiting voltage Ve, and the tunneling current does not flow from the floating gate to the substrate region so that the threshold voltage does not change.

Figure 12:
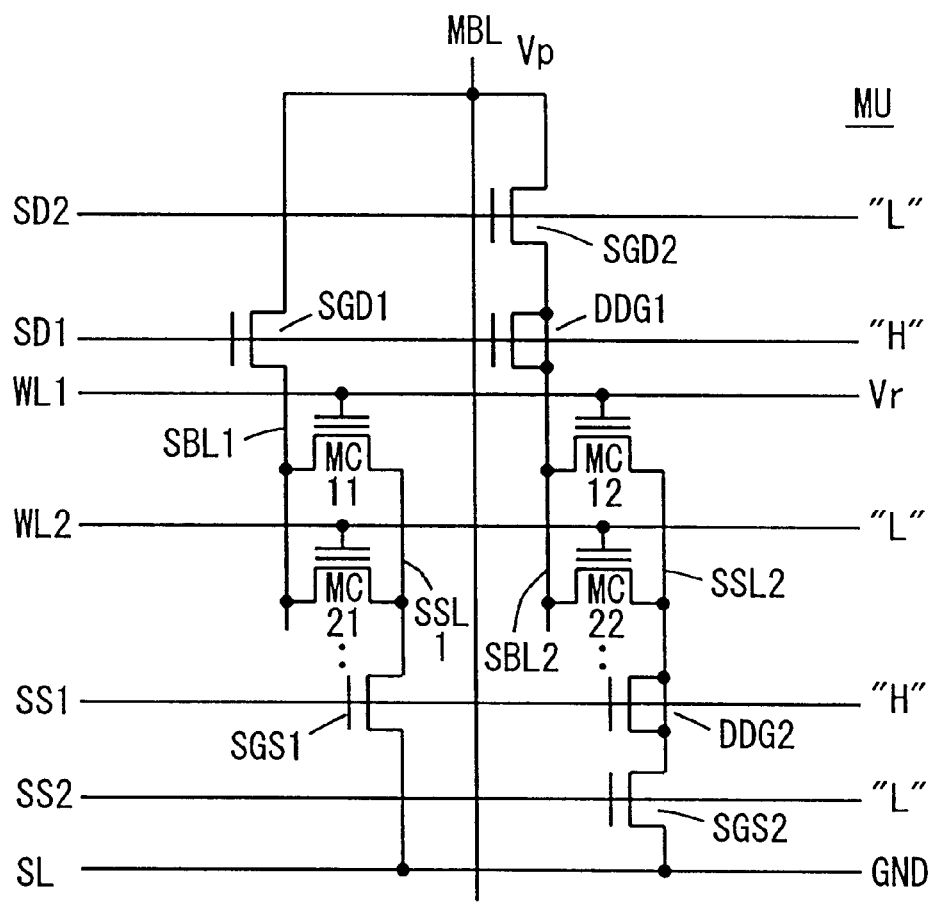
FIG. 12 shows applied voltage levels during a reading operation of the memory cell unit shown in FIG. 9.

FIG. 12 shows applied voltages during data reading in the memory cell unit according to the third embodiment of the invention. FIG. 12 shows the applied voltages in data reading of memory cell MC11. For reading the data from memory cell MC11, drain-side block select signal SD1 is set to H-level, and drain-side block select signal SD2 is set to L-level. Thereby, sub-bit line SBL1 is connected to main bit line MBL, and sub-bit line SBL2 is isolated from main bit line MBL. Source-side block select signal SS1 is set to H-level, and source-side block select signal SS2 is set to L-level. Thereby, sub-source line SSL1 is connected to source line SL, and sub-source line SSL2 is isolated from source line SL.

Main bit line MBL is supplied with precharge voltage Vp, and source line SL is set to ground voltage GND level. Read voltage Vr is transmitted onto word line WL1. In this state, a current flows or does not flow on main bit line MBL, depending on storage information of memory cell MC11. By detecting current flow/no current flow by the sense amplifier circuit, data reading is performed.

For reading data from memory cell MC12, drain-side block select signals SD1 and SD2 are set to L- and H-levels, respectively, and source-side block select signals SS1 and SS2 are set to L- and H-levels, respectively.

In this data read operation, source-side block select signals SS1 and SS2 are set to H- or L-level in accordance with the selected sub-bit line. During data reading, however, both source-side block select signals SS1 and SS2 may be set to H-level.

Figure 13:
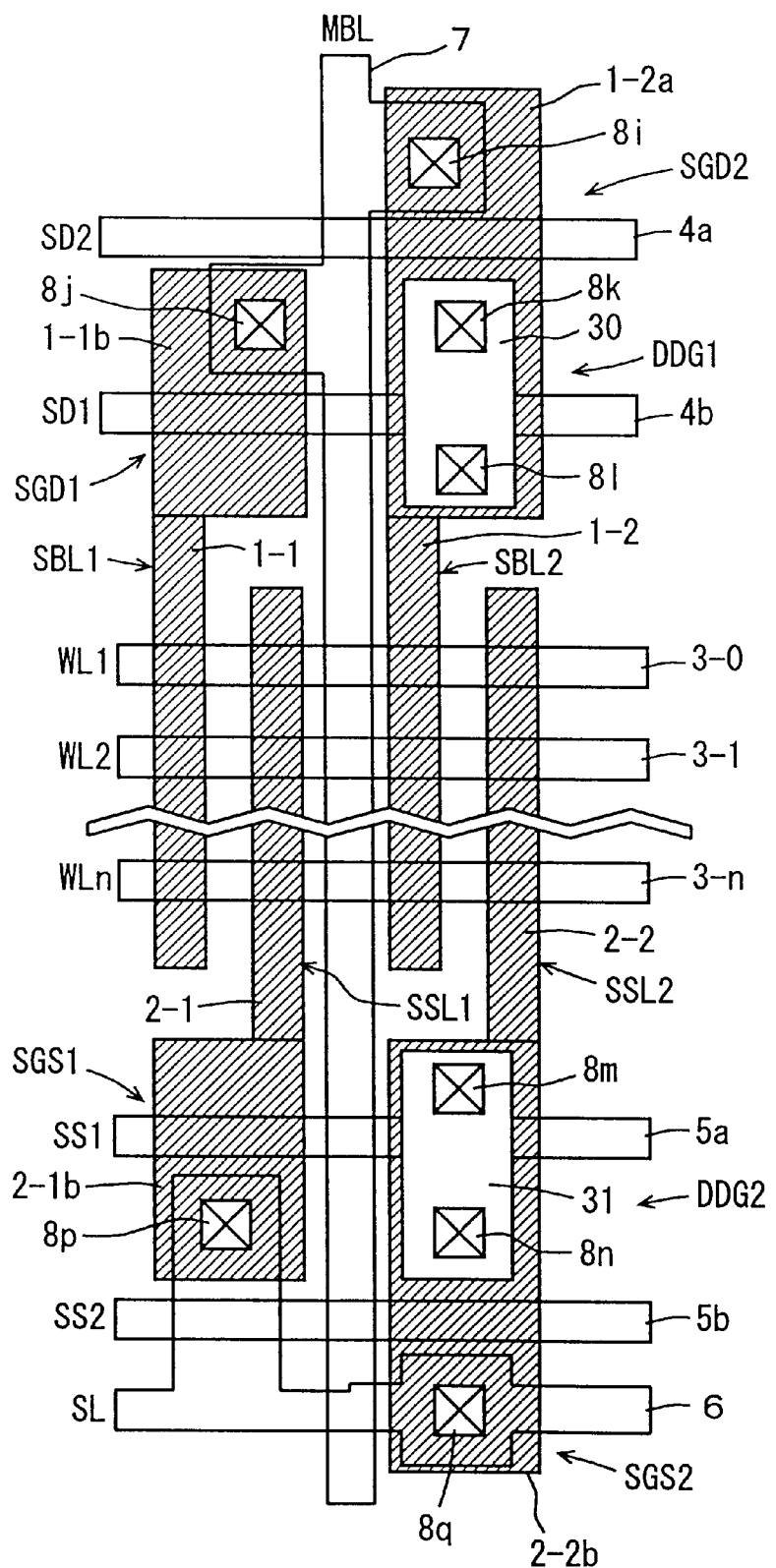
FIG. 13 schematically shows a planar layout of the memory cell unit shown in FIG. 9.

FIG. 13 schematically shows a planar layout of memory cell unit MU according to the third embodiment of the invention. In FIG. 13, impurity diffusion layers 1-1 and 1-2, which form sub-bit lines SBL1 and SBL2, respectively, extend in the column direction. In parallel with these impurity diffusion layers 1-1 and 1-2, impurity diffusion layers 2-1 and 2-2 forming sub-source lines SSL1 and SSL2 are formed. In a plan view, metal interconnection line 7 extending in the column direction to form main bit line MBL is arranged in a region between impurity diffusion layers 2-1 and 1-2.

Impurity diffusion layers 1-1 and 1-2 are connected to impurity diffusion regions 1-1b and 1-2a, which in turn have increased widths in the row direction and form the select transistors, respectively. Likewise, impurity diffusion layers 2-1 and 2-2 forming sub-source lines SSL1 and SSL2 are connected to impurity diffusion regions 2-1b and 2-2b provided for forming the select transistors, respectively.

Impurity diffusion region 1-1b is electrically connected to metal interconnection line 7 forming main bit line MBL via a contact hole 8j. Impurity diffusion region 1-2a is electrically connected to metal interconnection line 7 via a contact hole 8i. In impurity diffusion region 1-2a, the source and drain regions of dummy transistor (parasitic MOS transistor) DDG1 are short-circuited by a metal interconnection line 30 via contact holes 8k and 8j.

Impurity diffusion region 2-1b is electrically connected to conductive layer (metal interconnection line) 6 forming source line SL via a contact hole 8p. Impurity diffusion region 2-2b is likewise connected to conductive layer (metal interconnection line) 6 via a contact hole 8q.

A metal interconnection line 31 is arranged crossing conductive layer 5a transmitting source-side block select signal SS1 in impurity diffusion region 2-2b, and is electrically connected to impurity diffusion layers opposite relative to conductive layer 5a of impurity diffusion region 2-2b via contact holes 8m and 8n. Thereby, the source and drain of parasitic MOS transistor DDG2 are short-circuited.

A conductive layer (metal interconnection line) 4a transmitting block select signal SD2 is arranged across impurity diffusion region 1-2a, and a conductive layer 4b is formed across impurity diffusion regions 1-1a and 1-2a. Conductive layers 3-0–3-n forming respective word lines WL1–WLn are arranged across sub-bit lines SBL1 and SBL2 as well as sub-source lines SSL1 and SSL2.

Across impurity diffusion regions 2-1b and 2-2a, there are arranged conductive layers 5a and 5b, which in turn transmit source-side block select signals SS1 and SS2, respectively. Block select transistor SGS2 is formed in the crossing portion between conductive layer 5b and impurity diffusion region 2-2a. Block select transistor SGS1 is formed in a crossing region of conductive layer 5a across impurity diffusion region 2-1b.

Block select transistor SGD1 is formed in a crossing region of conductive layer 4b across impurity diffusion region 1-1b, and drain-side block select transistor SGD2 is formed in a crossing region of impurity diffusion region 1-2a across conductive layer 4a.

As can be seen from the layout in FIG. 13, source line SL is arranged commonly to sub-bit lines SBL1 and SBL2, and an area required for arranging the source lines can be reduced. Parasitic MOS transistors DDG1 and DDG2, which are inevitably formed, have the source and the drain regions short-circuited by metal interconnection lines 30 and 31, respectively. Thus the interconnection lines transmitting block select signals SD1, SD2, SS1 and SS2 can be arranged extending in the row direction, and required sub-bit line and sub-source line can be reliably selected and connected to the main bit line and source line, respectively, so that the operation can be performed accurately.

According to the third embodiment of the invention, as described above, the source line is arranged commonly to the sub-bit lines in each memory cell unit so that an area occupied by the source lines can be reduced. Since the sub-bit lines and sub-source lines are formed of the impurity diffusion layers, it is possible to eliminate an influence of the parasitic MOS transistors, which are inevitably formed, by short-circuiting the parasitic MOS transistors using the metal interconnection lines, and a desired operation can be accurately performed.

[Fourth Embodiment]

Figure 14:
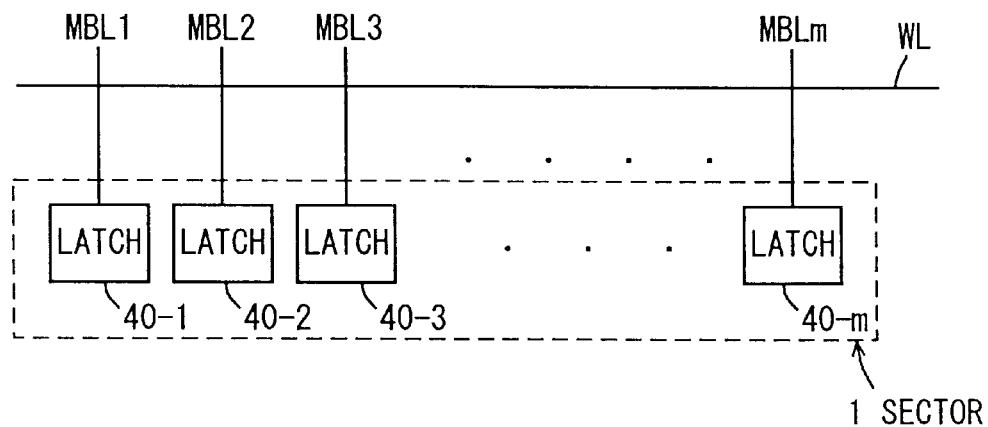
FIG. 14 schematically shows a structure of a main portion of the nonvolatile semiconductor memory device according to a fourth embodiment of the invention.
Figure 15:
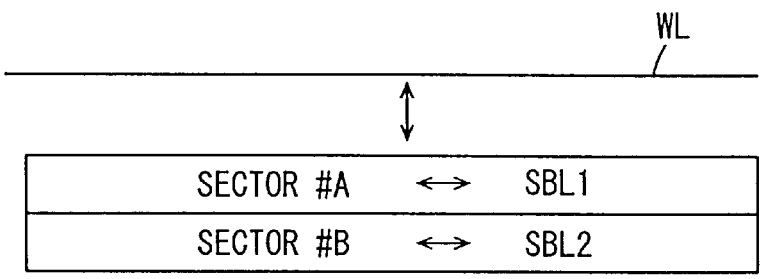
FIG. 15 schematically shows a correspondence between sectors and a word line.

FIG. 14 shows a corresponding between a word line and a sector in a fourth embodiment of the invention. In FIG. 14, main bit lines MBL1–MBLm are connected to latch/write circuits 40-1–40-m, respectively, each of which in turn latches the write data in the data write operation and produces the voltage corresponding to the write data in the programming operation performed after the erase operation. These latch/write circuits 40-1–40-m correspond to one sector. Writing of data is executed a sector at a time. 2·m sub-bit lines SBL are provided for word line WL. Accordingly, two sectors #A and #B correspond to word line WL as shown in FIG. 15. The data of sector #A is stored in the memory cells connected to sub-bit line SBL1, and the data of sector #B is stored in memory cells connected to sub-bit line SBL2. Writing and reading of the data are performed on a sector basis. In the case where one main bit line is provided corresponding to the sub-bit lines in multiple columns, it is necessary to read the data by switching the sub-bit lines after selecting a word line. In the case where one word line is made corresponding to one sector, the time for write/read increases due to switching of the sub-bit lines.

Figure 16:
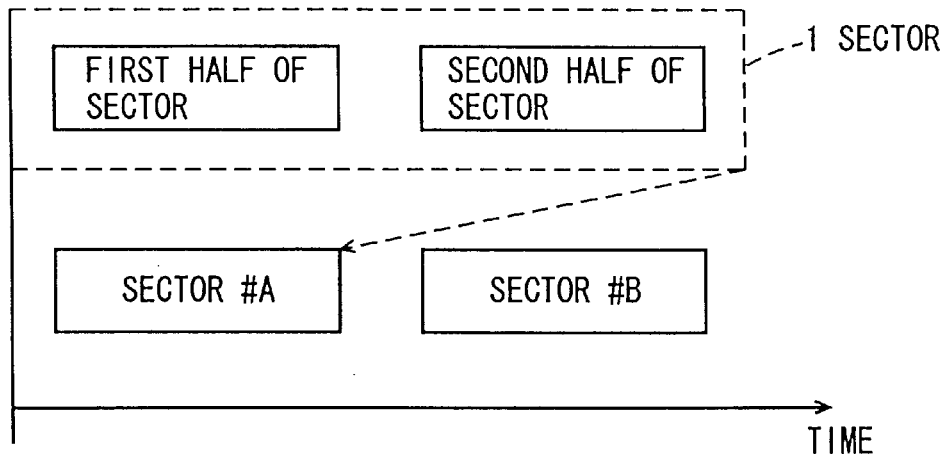
FIG. 16 schematically shows a time required for sector reading in the fourth embodiment of the invention.

When the data of one sector is to be accessed, write or read is performed on the memory cells in the first half of the selected sector owing to switching of the sub-bit lines, as shown in FIG. 16, and then write or read is performed on the memory cells in the second half of the sector. Accordingly, the contents of one sector is written or read a half sector at a time so that the access time increases. However, one word line WL is made corresponding to sectors #A and #B in accordance with the sub-bit lines, whereby contents of sector #A or #B can be written/read by one operation of accessing word line WL. Therefore, the access time for one sector can be reduced (although the amount of storage data in the sector is reduced by half. Thereby, increase in access time can be suppressed even in such a structure that the sub-bit lines in multiple columns are provided commonly to a main bit line.

Figure 17:
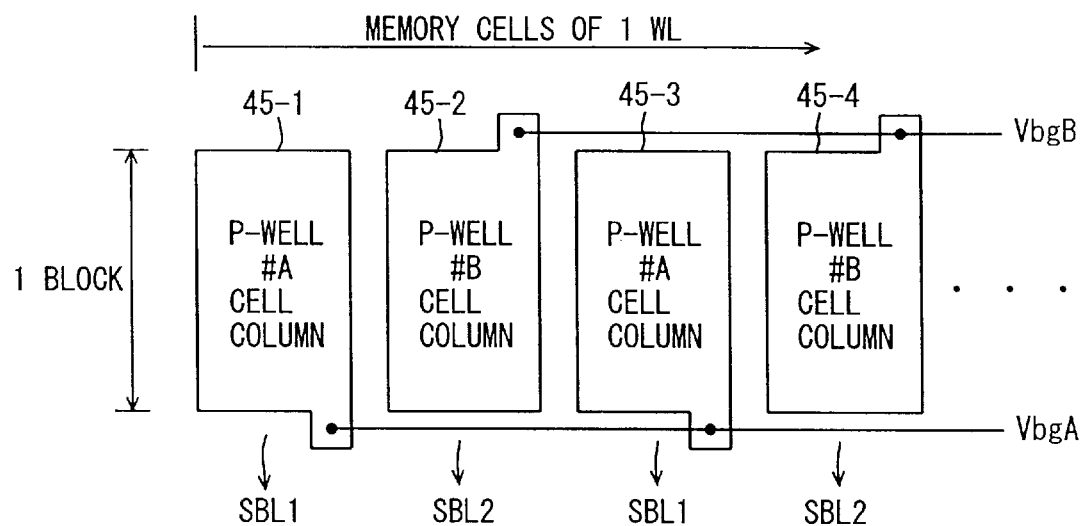
FIG. 17 schematically shows an arrangement of the memory cell forming regions in the fourth embodiment of the invention.

FIG. 17 schematically shows a structure of the memory cell array and substrate region. FIG. 17 shows a memory cell arranged region of one row block. In FIG. 17, P-wells 45-1, 45-2, . . . are provided, which are equal in number to the memory cells connected to one word line. In the P-well, the columns of memory cells of sector #A are formed in alternate P-wells, and the memory cell columns of sector #B are formed in the remaining alternate P-wells. More specifically, P-wells 45-1, 45-3, . . . are used as the substrate regions for forming the memory cell columns of sector #A, and P-wells 45-2, 45-4, . . . are used as the substrate regions for forming the memory cell columns of sector #B.

P-wells 45-1, 45-3, . . . are supplied with a substrate bias voltage VbgA, and P-wells 45-2, 45-4, . . . are supplied with substrate bias voltage VbgB. The memory cells of P-wells 45-1 and 45-2 are commonly connected to the main bit line. Although an isolation region is required between the wells, substrate bias voltages VbgA and VbgB can. be applied individually by forming the P-wells separately for sectors #A and #B. Thereby, the erase operation can be reliably performed a sector at a time even in such a structure that one word line is made corresponding to two sectors.

According to the fourth embodiment of the invention, as described above, since one word line is made corresponding to two sectors, increase in access time (write/read time) for each sector can be suppressed even in the structure that the main bit lines each are connected to the sub-bit lines in multiple columns.

[Fifth Embodiment]

Figure 18:
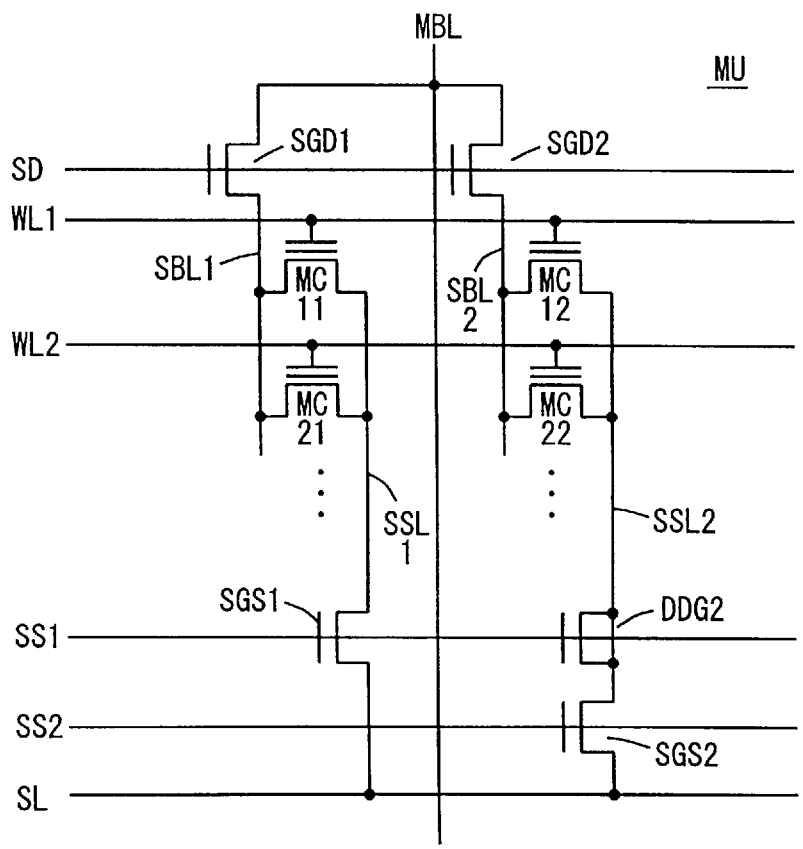
FIG. 18 schematically shows a structure of a memory cell unit according to an fifth embodiment of the invention.

FIG. 18 shows a structure of memory cell unit MU according to a fifth embodiment of the invention. In memory cell unit MU shown in FIG. 18, drain-side block select transistors SGD1 and SGD2 which are provided corresponding to sub-bit lines SBL1 and SBL2, respectively, are commonly supplied with drain-side block select signal SD. Source-side block select transistors SGS1 and SGS2 provided for sub-source lines SSL1 and SSL2 are supplied with different source-side block select signals SS1 and SS2, respectively. Source-side block select transistor SGS2 is coupled to sub-source line SSL2 via an aluminum interconnection line short-circuiting the drain and source of parasitic MOS transistor DDG2.

In this memory cell unit MU shown in FIG. 18, n memory cells are connected to each of sub-bit lines SBL1 and SBL2. However, FIG. 18 shows representatively memory cells MC11 and MC21 connected to sub-bit line SBL1 as well as memory cells MC12 and MC22 connected to sub-bit line SBL2.

Commonly to sub-bit lines SBL1 and SBL2, there is arranged a signal line transmitting drain-side block select signal SD so that the area occupied by the interconnection lines can be reduced. Brief description will now be given on operations.

Figure 19:
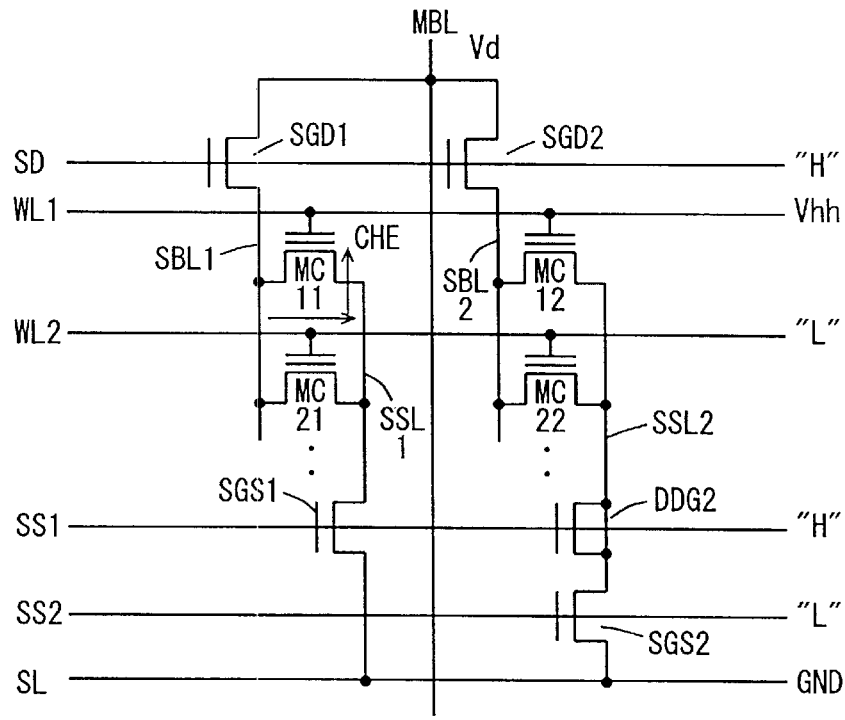
FIG. 19 shows applied voltage levels during a programming operation of the memory cell unit shown in FIG. 18.

FIG. 19 shows voltage levels of various signals in the operation of programming data into memory cell MC11. In the data programming operation, drain voltage Vd is applied to main bit line MBL. The drain-side block select signal SD is set to H-level higher than drain voltage Vd, and word line WL1 is supplied with programming high voltage Vhh. Source line SL is set to ground voltage GND, and source-side block select signals SS1 and SS2 are set to H- and L-levels, respectively. In this state, both sub-bit lines SBL1 and SBL2 are connected to main bit line MBL, and sub-source line SSL1 is connected to source line SL. Sub-source line SSL2 is electrically floated. Unselected word line WL2 is maintained at L-level (ground voltage level).

In this state, in memory cell MC11 a current flows from sub-bit line SBL1 to source line SL to cause a channel current to flow in accordance with drain voltage Vd transmitted from main bit line MBL, and electrons are accelerated by a drain electric field to be channel hot electrons (CHE) to be injected into the floating gate. Thus, memory cell MC11 attains a high threshold voltage state. In memory cell MC21, drain voltage Vd is likewise applied. However, sub-source line SSL2 is in the electrically floating state so that a channel current and channel hot electrons (CHE) do not occur. Therefore, electrons are not injected into the floating gate.

In the operation of programming data into memory cell MC21, source-side block select signals SS1 and SS2 are set to L- and H-levels.

In the case of maintaining memory cell MC11 in the erased state, ground voltage GND is transmitted onto main bit line MBL. In memory cell MC11, the drain and source are at the same voltage so that a channel current does not flow to cause no channel hot electrons (CHE).

In the erase operation, the erasing is executed a sector at a time. All select signals SD, SS1 and SS2 are set to H-level, and source line SL is set to positive voltage Vps level. Word line WL1 is set to the level of negative voltage −VN, and the unselected word line VWL2 is set to the level of erase inhibiting voltage Ve. Positive voltage Vps is applied to the substrate regions of the memory cells on a sector basis. In accordance with the voltage difference (Vps+VN) of the control gate with respect to the substrate region and the source/drain regions of the memory cell, electrons are ejected by the tunneling current from the floating gate to the substrate region and the source/drain regions so that the memory cell in the erased state attains the low threshold voltage state.

In the above erasing operation, sub-bit lines SBL1 and SBL2 as well as sub-source lines SSL1 and SSL2 are set merely to the electrically floating state so that the erase operation (substrate erase operation) is performed by moving the electrons only between the substrate region and the floating gate. Even in the case where one word line corresponds to a plurality of sectors, erasing can be reliably performed reliably a sector at a time.

Figure 20:
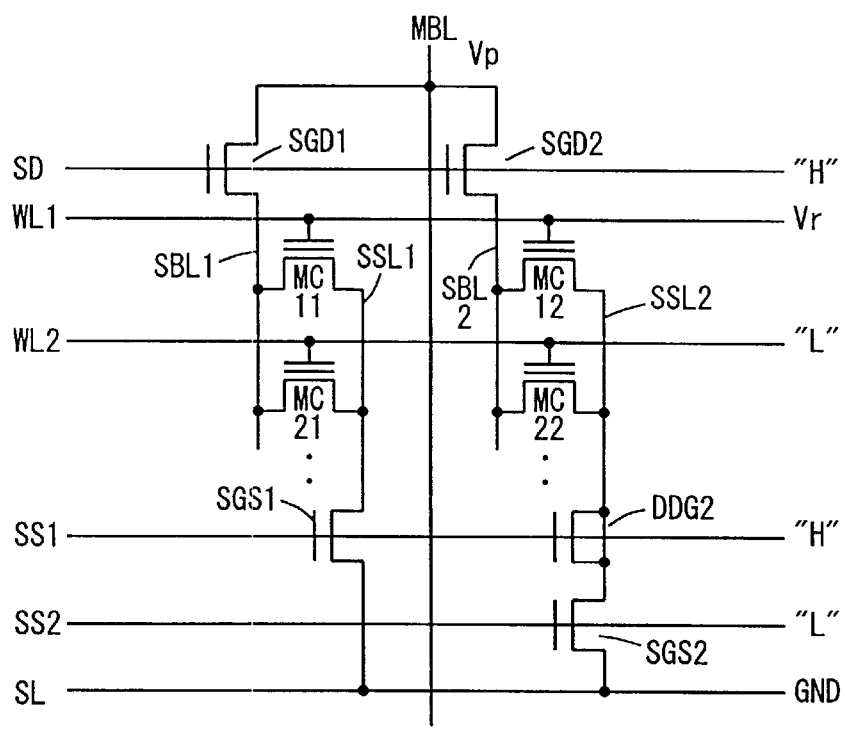
FIG. 20 shows applied voltage levels during a read operation of the memory cell unit shown in FIG. 18.

FIG. 20 shows the voltage levels of various signals during data reading from memory cell MC11. In the data read operation, precharge voltage Vp is applied to main bit line MBL (from the sense amplifier circuit).

Drain-side block select signal SD is set to H-level, and main bit line MBL is electrically connected to sub-bit lines SBL1 and SBL2 via drain-side block select transistors SGD1 and SGD2, respectively. Source-side block select signals SS1 and SS2 are set to H- and L-levels, respectively. Sub-source line SSL2 is set to the electrically floating state, and a path of the current flowing through memory cell MC12 is cut off, regardless of storage data of memory cell MC12. Meanwhile, sub-source line SSL1 is connected to source line SL at the ground voltage level, and a current flows from main bit line MBL to sub-source line SSL1 via sub-bit line SBL1 in accordance with the storage data of memory cell MC11. Flow/non-flow of this current is detected by the sense amplifier circuit, and reading of the data is executed.

Upon reading the data from memory cell MC12, source-side block select signals SS1 and SS2 are set to L- and H-levels, respectively.

A portion of generating each block select signal in this fifth embodiment of the invention is implemented by commonizing drain-side block select signals SD1 and SD2 (by OR operation on SD1 and SD2) in the foregoing first embodiment, and the respective block select signals can be produced by the structure similar to that shown in FIG. 7. The same is true also for the source-side block select signals. The signal voltage levels of source-side block select signals SS1 and SS2 are set merely in accordance with which of sub-bit line SBL1 and SBL2 is subject to writing or reading (in the write/read operation).

According to the fifth embodiment of the invention, the arrangement of sub-bit lines SBL1 and SBL2 allow the use of a common signal as the drain-side block select signals for the sub-bit lines, and therefore an area occupied by the interconnection lines can be reduced. Further, the structure of the control circuit can be simplified.

[Sixth Embodiment]

Figure 21:
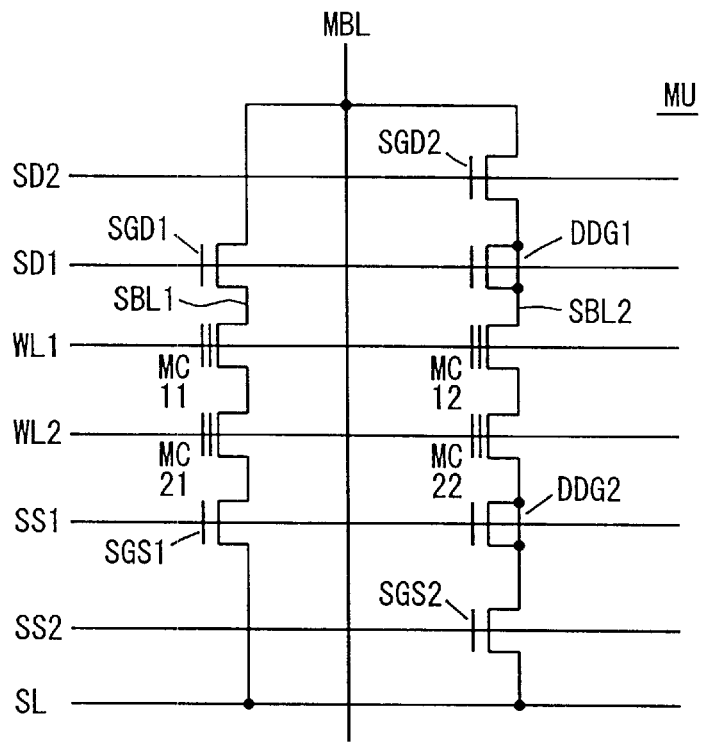
FIG. 21 shows a structure of a memory cell unit according to a sixth embodiment of the invention.

FIG. 21 shows a structure of a memory cell unit according to a sixth embodiment of the invention. In FIG. 21, each of sub-bit lines SBL1 and SBL2 is coupled in series to a plurality of memory cells MC. In FIG. 21, memory cells MC11 and MC21 are connected in series to sub-bit line SBL1, and memory cells MC12 and MC22 are connected in series to sub-bit line SBL2.

Sub-bit line SBL1 is electrically connected to main bit line MBL via drain-side block select transistor SGD1 receiving drain-side block select signal SD1 on its gate. Sub-bit line SBL2 is electrically connected to main bit line MBL via drain-side block select transistor SGD2 receiving drain-side block select signal SD2 on its gate. Since sub-bit line SBL2 is formed of an impurity diffusion layer (impurity region), parasitic MOS transistor DDG1 is formed between source-side block select signal SS1 and sub-bit line SBL2. The source and drain of parasitic MOS transistor DDG1 are short-circuited by a metal interconnection line similarly to the structure shown in FIG. 9.

The source of memory cell MC21 connected to sub-bit line SBL1 is electrically connected to source line SL via source-side block select transistor SGS1 receiving source-side block select transistor SS1 on its gate.

The source (sub-source line) of memory cell MC22 connected to sub-bit line SBL2 is electrically connected to source line SL via source-side block select transistor SGS2 receiving source-side block select signal SS2 on its gate. Since the source region of memory cell MC22 is formed of an impurity diffusion layer, and is connected to the drain region of source-side block select transistor SGS2, the signal line transmitting source-side block select signal SS1 is accompanied by parasitic MOS transistor (dummy transistor) DDG2. The source and drain of parasitic MOS transistor DDG2 is electrically short-circuited by a metal interconnection line.

In memory cell unit MU shown in FIG. 21, block select signals SD1 and SS1 are set to the active state at H-level for reading data onto sub-bit line SBL1, and block select signals SD2 and SS2 are set to the inactive state at L-level. In the read operation, source line SL is supplied with ground voltage GND. In the programming operation, both source-side block select signals SS1 and SS2 are set to the inactive state at L-level.

In the erase operation, the erase high voltage is applied to main bit line MBL and source line SL similarly to the case of memory cell unit MU shown in FIG. 8, and the erase high voltage is also applied to the substrate region. Word lines WL1 and WL2 are held at the ground voltage level. The programming and erasing are performed by a tunneling current between the floating gate and the substrate region.

Even in the NAND-type memory cell structure shown in FIG. 21, drain-side block select signals SD1 and SD2 as well as source-side block select signals SS1 and SS2 are utilized, whereby source line SL can be arranged commonly to sub-bit lines SBL1 and SBL2.

[Seventh Embodiment]

Figure 22:
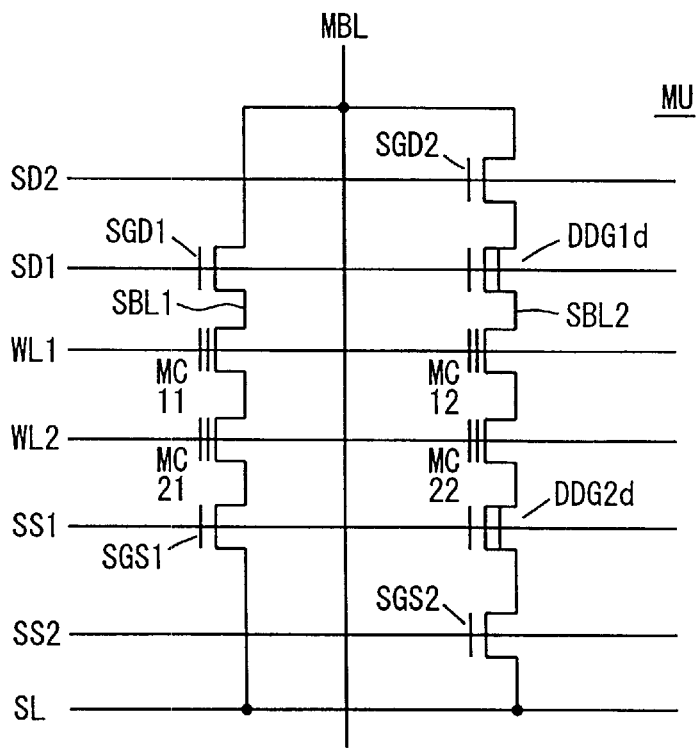
FIG. 22 shows a structure of a memory cell unit according to a seventh embodiment of the invention.

FIG. 22 shows a structure of a memory cell unit MU according to a seventh embodiment of the invention. In memory cell unit MU shown in FIG. 22, a parasitic MOS transistor formed between sub-bit line SBL2 and drain-side block select transistor SGD2 is formed of a depletion type MOS transistor DDG1d. Further, a parasitic MOS transistor between memory cell MC22 and source-side block select transistor SGS2 is formed of a depletion type MOS transistor DDG2d. Each of depletion type MOS transistors DDG1d and DDG2d is set to a normally on state by implantation of impurity into a channel region instead of use of the metal interconnection line. Since the parasitic MOS transistor is formed of the depletion type MOS transistor, the metal interconnection line (see FIG. 13) for short-circuiting the parasitic MOS transistor is not required.

Structures of memory cell unit MU shown in FIG. 22 other than the above are the same as those of the memory cell unit shown in FIG. 21, and the corresponding portions bear the same reference characters. [Eighth Embodiment]

Figure 23:
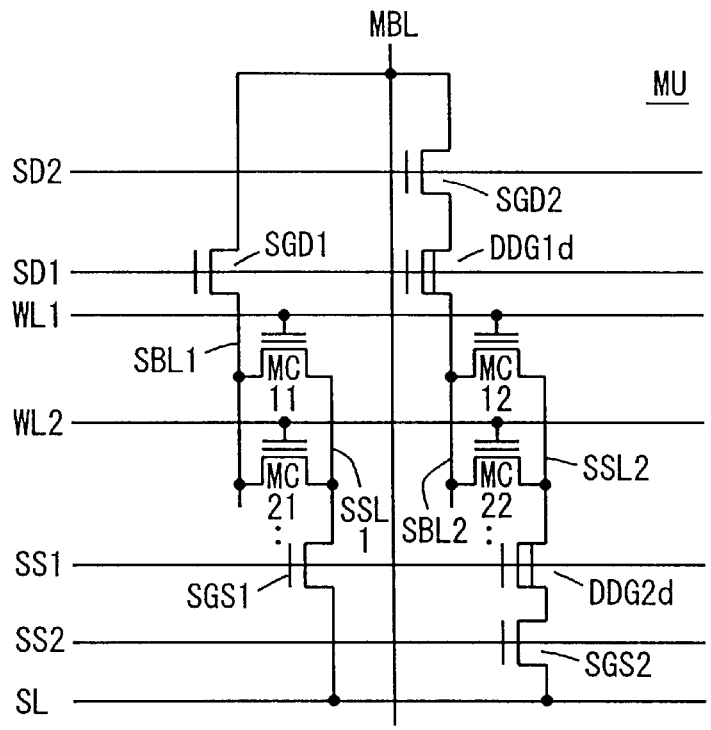
FIG. 23 shows a structure of a memory cell unit according to an eighth embodiment of the invention.

FIG. 23 shows a structure of a memory cell unit MU according to an eighth embodiment of the invention. Memory cell unit MU shown in FIG. 23 differs in structure from memory cell unit MU shown in FIG. 12 in the following points. The parasitic MOS transistor between sub-bit line SBL2 and drain-side block select transistor SGD2 is formed of depletion type MOS transistor DDG1d. The parasitic MOS transistor formed between sub-source line SSL2 and source-side block select transistor SGS2 is formed of depletion type MOS transistor DDG2d.

By forming the parasitic MOS transistor into depletion type MOS transistor, it is possible to achieve the effects similar to those by the structure in which the metal interconnection line is used for short-circuiting the source and drain regions of the parasitic MOS transistor.

[Modification]

Figure 24:
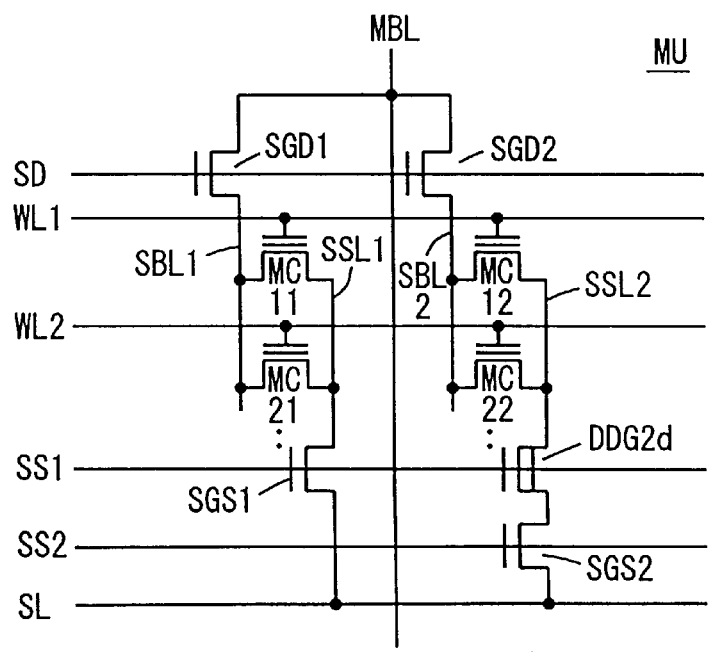
FIG. 24 shows a modification of the eighth embodiment of the invention.

FIG. 24 shows a structure of a memory cell unit of a modification of the eighth embodiment of the invention. The structure of memory cell unit MU shown in FIG. 24 differs from that of memory cell unit MU shown in FIG. 18 in the following point.

The parasitic MOS transistor between sub-source line SSL2 and source-side block select transistor SGS2 is formed of depletion type MOS transistor DDG2d.

In the structure of memory cell unit MU shown in FIG. 24, depletion type MOS transistor DDG2d is normally in the on state independently of the voltage level of source-side block select signal SS1 applied to the gate of transistor DDG2d, and it is possible to achieve the effects similar to those of the structure in which the source and drain of parasitic MOS transistor DDG2d are short-circuited by the metal interconnection line as shown in FIG. 18.

[Ninth Embodiment]

Figure 25:
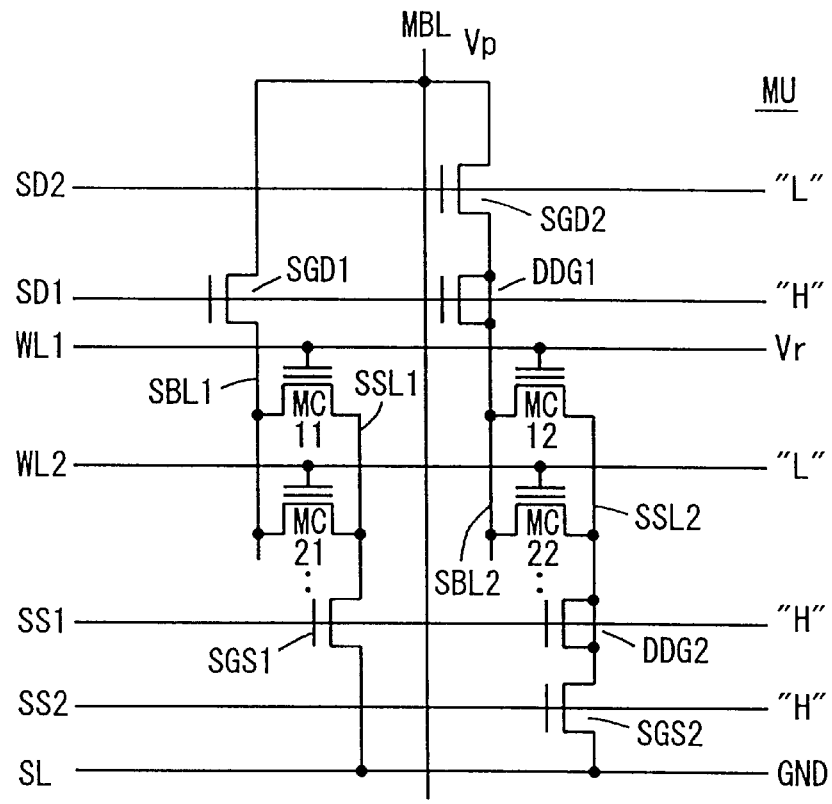
FIG. 25 shows applied voltage levels during data reading of the memory cell unit according to the ninth embodiment of the invention.
Figure 26:
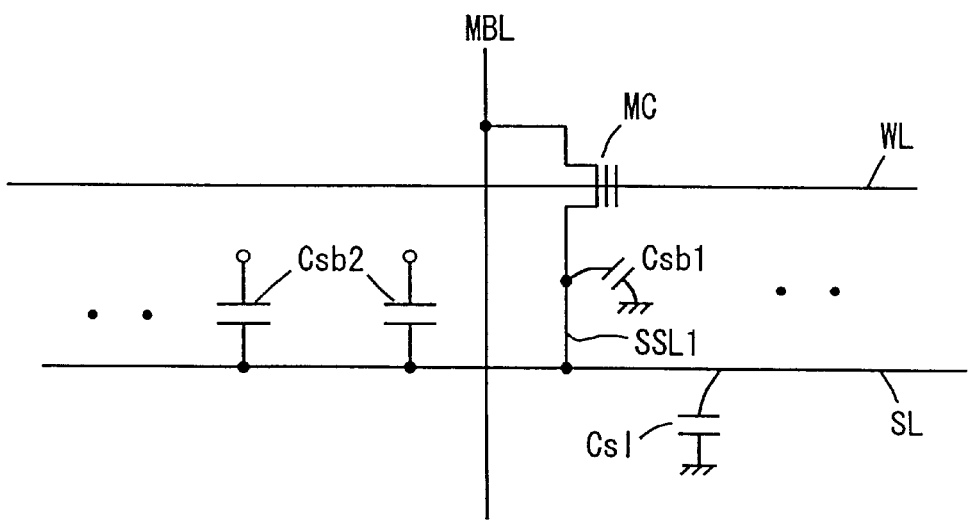
FIG. 26 shows a distribution of parasitic capacitances of the source line during data reading in the memory cell unit arrangement shown in FIG. 25.
Figure 27:
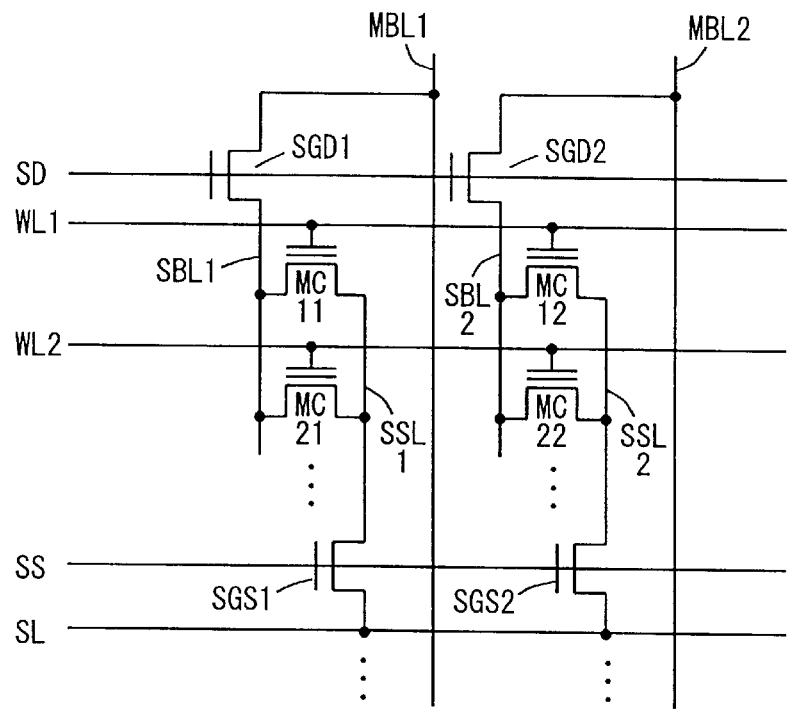
FIG. 27 shows a structure of a memory array of a nonvolatile semiconductor memory device in the prior art.
Figure 28:
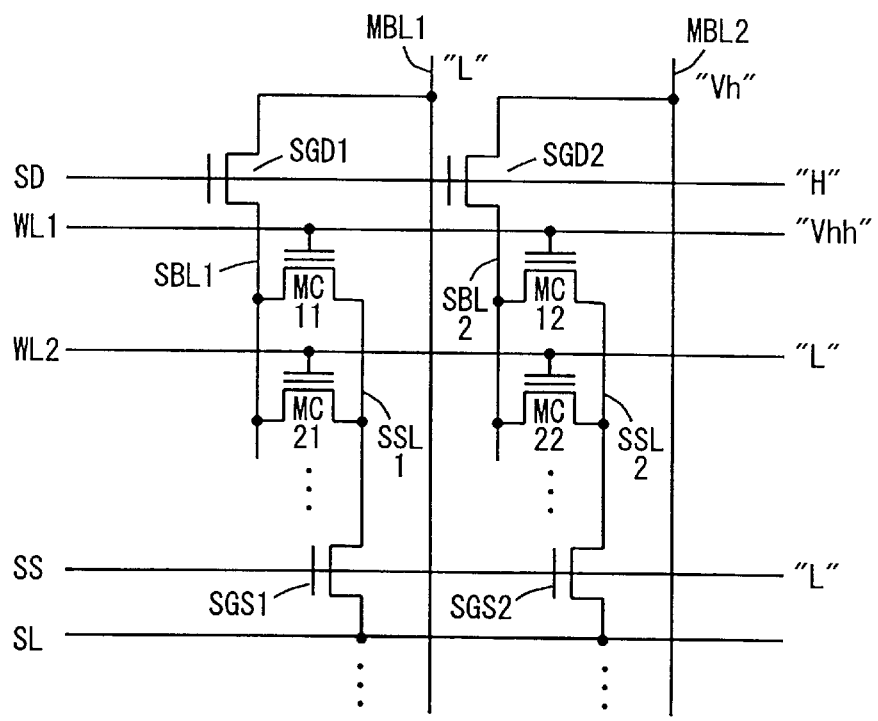
FIG. 28 shows applied voltage levels during a programming operation of the memory cell array shown in FIG. 27.
Figure 29:
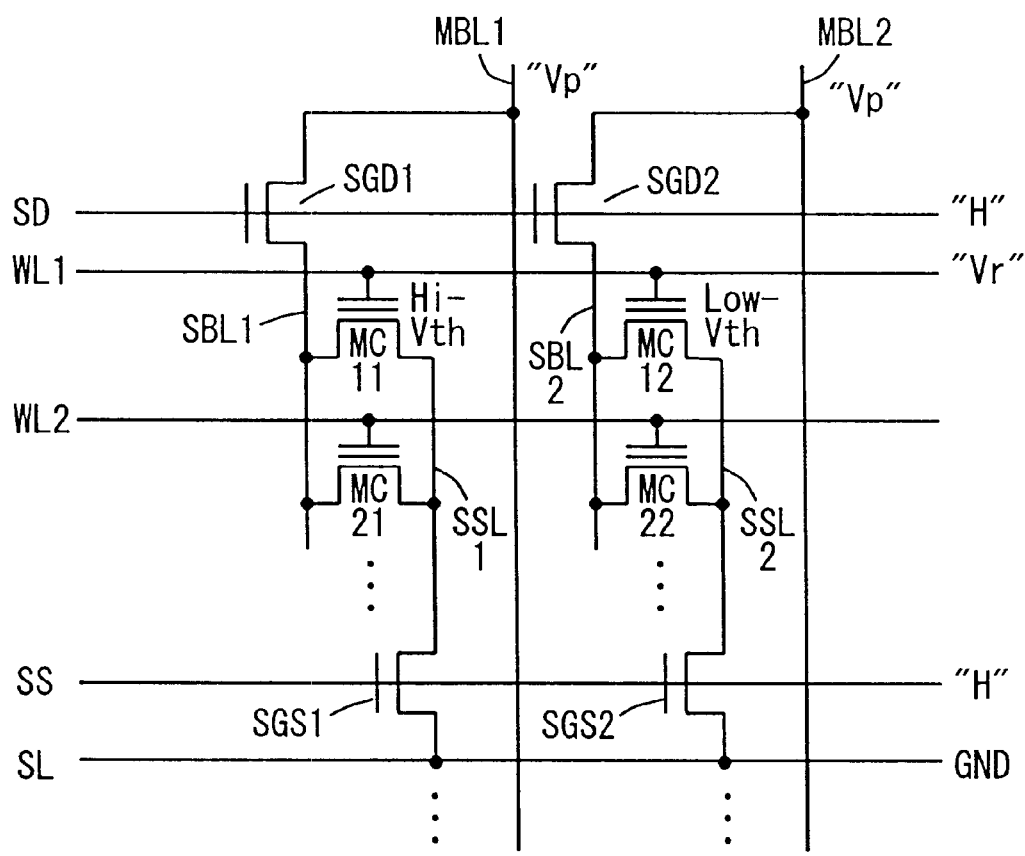
FIG. 29 shows applied voltage levels during data reading of the memory cell array shown in FIG. 27.
Figure 30:
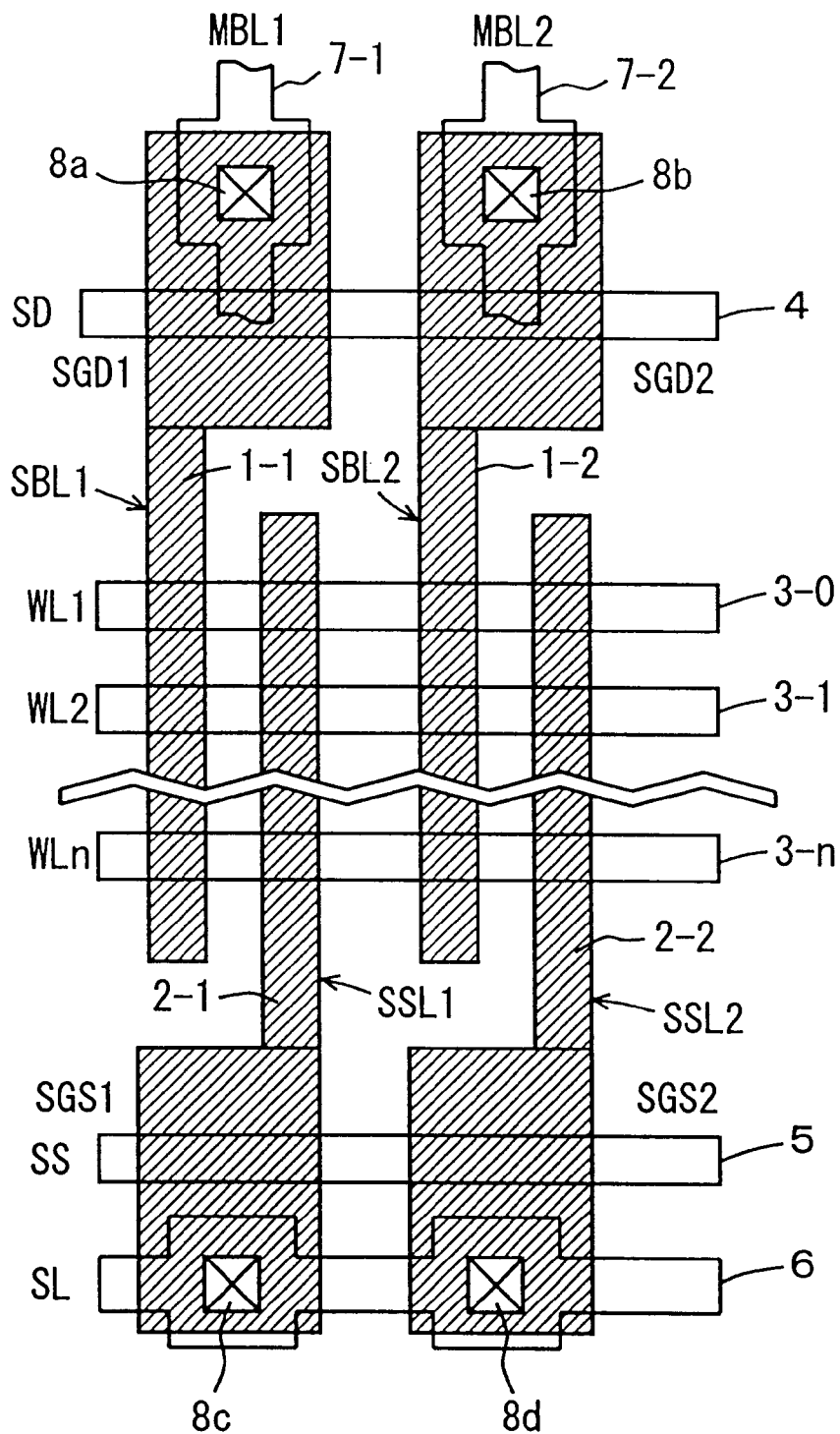
FIG. 30 schematically shows a planar layout of the memory cell array shown in FIG. 27.
Figure 31:
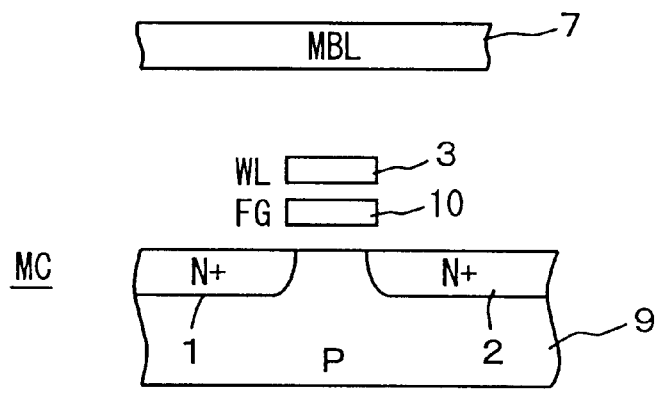
FIG. 31 schematically shows a sectional structure of memory cells in the nonvolatile semiconductor memory device in the prior art.
Figure 32:
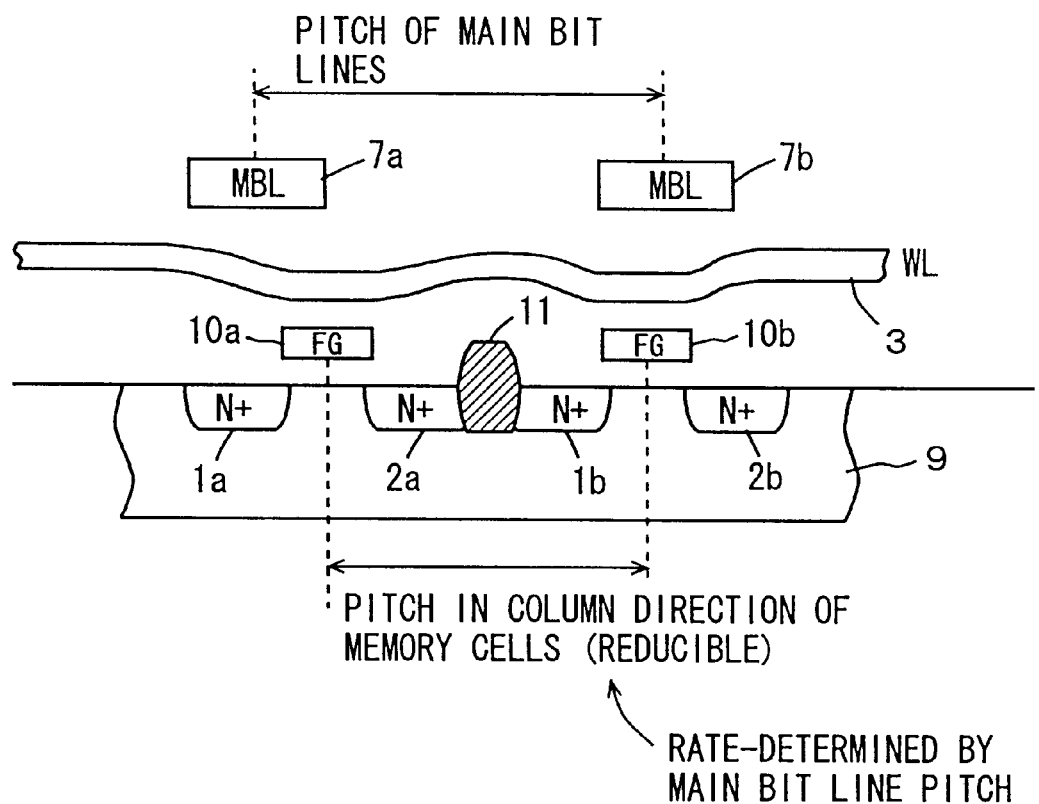
FIG. 32 schematically shows a sectional structure in the column direction of the memory cells of the nonvolatile semiconductor memory device in the prior art.

FIG. 25 shows applied voltages during data reading of a memory cell unit according to a ninth embodiment of the invention. In memory cell unit MU shown in FIG. 25, sub-bit line SBL1 is electrically connected to main bit line MBL via block select transistor SGD1 receiving drain-side block select transistor SD1 on its gate, and sub-bit line SBL2 is electrically connected to main bit line MBL via block select transistor SGD2 receiving another drain-side block select signal SD2 on its gate.

Sub-source line SSL1 is electrically connected to source line SL via block select transistor SGS1 receiving source-side block select signal SS1 on its gate, and sub-source line SSL2 is electrically connected to source line SL via block select transistor SGS2 receiving source-side block select signal SS2 on its gate.

In FIG. 25, parasitic MOS transistor (dummy transistor) DDG1 is formed between sub-bit line SBL2 and drain-side block select transistor SGD2, and parasitic MOS transistor (dummy transistor) DDG2 is formed between sub-source line SSL2 and source-side block select transistor SGS2. Each of parasitic MOS transistors DDG1 and DDG2 has the source and drain short-circuited by the metal interconnection line. However, parasitic MOS transistors DDG1 and DDG2 may be formed of the depletion type MOS transistors as already described and shown in FIG. 23.

In the data read operation, both source-side block select signals SS1 and SS2 are set to H-level, and both sub-source lines SSL1 and SSL2 are electrically connected to source line SL. One of sub-bit lines SBL1 and SBL2 is selected by block select signals SD1 and SD2, and is electrically connected to main bit line MBL via selected transistor SGD1 or SGD2. In FIG. 25, block select signal SD1 is set to the selected state at H-level, and sub-bit line SBL1 is electrically connected to main bit line MBL.

In this state, drain-side block select transistor SGD2 is off, and sub-bit line SBL2 is in the electrically floating state. Reading of data from memory cell MC11 is performed by applying precharge voltage Vp onto main bit line MBL to detect whether a current flows on main bit line MBL or not.

In the case where both source-side block select signals SS1 and SS2 are set to H-level as shown in FIG. 25, a parasitic capacitance Csb2 of sub-source line SSL2 is connected in parallel to source line SL. Likewise, a parasitic capacitance Csb1 of sub-source line SSL1 is connected in parallel. This source line SL is electrically connected to the sub-source lines in one row block. Therefore, a parasitic capacitance Cs1 of source line SL can be large. When a current flows from main bit line MBL to source line SL via a memory cell MC, the charges applied from main bit line MBL to sub-bit line SBL can be rapidly discharged to source line SL owing to an increased capacitance value of the parasitic capacitance of source line SL. Thus, owing to the large capacitance value of parasitic capacitance Cs1 of source line SL, rising of voltage on source line SL is suppressed even when the discharging current flows to source line SL via the selected memory cell MC11, and therefore it is possible to suppress lowering of the discharging speed of the discharging current, which lowering may be caused by the rising of voltage on source line SL. Accordingly, fast data reading can be achieved.

In the data read operation, it is necessary to change only drain-side block select signals SD1 and SD2, and source-side block select signals SS1 and SS2 can be fixed to H-level, which scheme allows easy control.

The structure in which sub-source lines SSL1 and SSL2 are coupled commonly to source line SL in the data read operation can likewise be applied to NAND-type memory cells shown in FIGS. 21 and 22, in which the memory cells are connected in series to a sub-bit line.

According to the ninth embodiment of the invention, as described above, the sub-source lines are commonly and electrically connected to the source line during data reading. Therefore, the source line can have a large parasitic capacitance, and the discharging current flowing through a selected memory cell can be absorbed fast so that the read operation can be performed fast.

According to the invention, as described above, the area of the memory cells in the row-extending direction can be reduced without restrictions by the pitch conditions of the main bit lines, and therefore the nonvolatile semiconductor memory device having the memory cell array of a high-density structure can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a plurality of nonvolatile memory cells arranged in rows and columns, said plurality of nonvolatile memory cells being divided along a row direction into a plurality of groups each including at least two columns of the memory cells, and being divided along a column direction into a plurality of blocks;
    a plurality of sub-bit lines arranged corresponding to the memory cell columns in the blocks, respectively, said plurality of sub-bit lines each connected to the nonvolatile memory cells in a corresponding column in a corresponding block, and each of said plurality of sub-bit lines formed of a first impurity layer at a surface of a semiconductor substrate;
    a plurality of sub-source lines formed of second impurity layers at the surface of said semiconductor substrate and provided corresponding to the memory cell columns in the groups in each of the blocks, each sub-source line acting as sources of the nonvolatile memory cells in a column in a corresponding group of a corresponding block;
    a plurality of main bit lines each provided corresponding to the group of the nonvolatile memory cells and commonly to the sub-bit lines of each of the blocks of a corresponding group;
    a plurality of drain block select gates each provided corresponding to the sub-bit line for connecting a corresponding sub-bit line to a corresponding main bit line when made conductive;
    a plurality of main source lines each provided corresponding to the block and commonly to the sub-source lines of a corresponding block; and
    source block select gates each provided corresponding to the sub-source line for connecting a corresponding sub-source line to a corresponding main source line when made conductive.

2. The nonvolatile semiconductor memory device according to claim 1, wherein
    said drain block select gate includes at least:
    a drain block select transistor responsive to a first drain block select signal specifying a memory cell column and a block in a group, and
    a drain dummy transistor connected in series to said drain block select transistor, and turned on in response to a second source block select signal specifying a memory cell column and a block of a group; and
    said source block select gate includes at least:
    a source select transistor turned on in response to a first source block select signal specifying a memory cell column and a block in a group, and
    a source dummy transistor turned on in response to a second drain block select signal specifying a memory cell column and a block in a group, said source dummy transistor having a first conduction node connected to said source select transistor and a second conduction node in an open state.

3. The nonvolatile semiconductor memory device according to claim 2, wherein
    the main source line is connected to said source select transistor and said first conduction node of said source dummy transistor.

4. The nonvolatile semiconductor memory device according to claim 2, wherein
    the main source lines are arranged corresponding to the memory cell columns in each of said groups, respectively.

5. The nonvolatile semiconductor memory device according to claim 1, wherein
    a memory unit defined by the group and the block includes two sub-bit lines, and the drain block select gates and the source block select gates arranged on said two sub-bit lines are arranged to couple corresponding sub-bit lines to opposing nodes of a corresponding main bit line.

6. The nonvolatile semiconductor memory device according to claim 1, wherein
    the drain block select gate includes a drain block select transistor turned on to electrically connect a corresponding sub-bit line to a corresponding main bit line in response to a drain block select signal specifying a block and a group; and
    the source block select gate includes a source select transistor turned on in response to a source block select signal specifying a block and a group, to electrically connect a corresponding sub-source line to the main source line, said main source line arranged commonly to the sub-source lines of the memory cells of a common block.

7. The nonvolatile semiconductor memory device according to claim 6, wherein
    said drain block select gate further includes a drain dummy transistor connected in series to said drain block select transistor, having a gate receiving a drain block select signal specifying another column in a common group and maintaining a conductive state independently of a level of the received drain block select signal; and
    said source block select gate includes a source dummy transistor connected in series to said source select transistor, having a gate receiving a source block select signal specifying another column in a common group and maintaining a conductive state independently of a level of the received source block select signal.

8. The nonvolatile semiconductor memory device according to claim 7, wherein
    a memory unit defined by the block and the group includes first and second sub-bit lines, and
    said drain dummy transistor and said source dummy transistor are arranged for one of said first and second sub-bit lines.

9. The nonvolatile semiconductor memory device according to claim 7, wherein
a memory unit defined by the block and the group includes first and second sub-bit lines,
the drain block select transistors for said first and second sub-bit lines are arranged at ends on a same side of said first and second sub-bit lines, and
the source block select gates for said first and second sub-bit lines are arranged at ends on a same side of said first and second sub-bit lines, and are opposed to said drain block select transistors.

10. The nonvolatile semiconductor memory device according to claim 7, wherein
said source dummy transistor and said drain dummy transistor are formed of depletion type insulated gate field effect transistors, respectively.

11. The nonvolatile semiconductor memory device according to claim 7, wherein
each of said drain dummy transistors and said source dummy transistors has a drain and a source electrically short-circuited by a low resistance conductor.

12. The nonvolatile semiconductor memory device according to claim 6, wherein
the source block select gates in a memory unit defined by a block and a group in the data read mode are all turned on by said source block select signal, and the sub-source lines are electrically connected to the corresponding main source line.

13. The nonvolatile semiconductor memory device according to claim 1, further comprising:
means for, in the data programming mode, turning on the source select gate of an unselected sub-bit line and apply a program inhibiting voltage to a corresponding sub-source line when the drain select gate for a selected sub-bit line is conductive in a memory unit defined by the block and the group.

14. The nonvolatile semiconductor memory device according to claim 1, wherein
the memory cells on different columns in a memory unit defined by the group and the block store data of different sectors, respectively, and a word line corresponding to one memory cell row stores data of a plurality of sectors.

15. The nonvolatile semiconductor memory device according to claim 1, wherein
a memory unit defined by one block and one group includes first and second sub-bit lines connected the memory cells on different columns,
the drain block select gate for the memory unit includes a first drain block select transistor for connecting a first sub-bit line to a corresponding main bit line in response to a first drain block select signal, a second drain block select transistor for connecting a second sub-bit line to the corresponding main bit line in response to a second drain block select signal, and a dummy drain select transistor connected in series to said second drain block select transistor and made normally conductive and having a control gate receiving the first drain block select signal, and
the source block select gate for the memory unit includes a first source select transistor for connecting the first sub-bit line to a corresponding source line in response to a first source block select signal, a second source select transistor for connecting the second sub-bit line to the corresponding source line in response to a second source block select signal, and a source dummy transistor connected in series to said second source select transistor and having a control gate receiving said first source block select signal and made normally conductive.

16. The nonvolatile semiconductor memory device according to claim 15, wherein the first and second drain block select signals are different select signals, and the first and second source block select signals are different select signals.

17. The nonvolatile semiconductor memory device according to claim 15, wherein the first and second drain block select signals are a common select signal, and the first and second source block select signals are a common select signal.

18. The nonvolatile semiconductor memory device according to claim 1, wherein the memory cells arranged alignedly in the row direction are formed on separated substrate regions on a semiconductor substrate, respectively.

* * * * *